(12) United States Patent
Srinivasan et al.

(10) Patent No.: US 7,054,993 B1
(45) Date of Patent: May 30, 2006

(54) TERNARY CONTENT ADDRESSABLE MEMORY DEVICE

(75) Inventors: Varadarajan Srinivasan, Los Altos Hills, CA (US); Sandeep Khanna, Santa Clara, CA (US); Bindiganavale S. Nataraj, Cupertino, CA (US); Rupesh R. Roy, Santa Clara, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 168 days.

(21) Appl. No.: 10/055,058

(22) Filed: Jan. 22, 2002

Related U.S. Application Data

(63) Continuation-in-part of application No. 09/829,355, filed on Apr. 9, 2001.

(51) Int. Cl.
*G06F 12/00* (2006.01)

(52) U.S. Cl. .............. 711/108; 370/374; 370/392; 370/395.7; 370/409; 365/49; 365/50

(58) Field of Classification Search .......... 365/49, 365/50; 370/374, 392, 395.7, 409; 711/108
See application file for complete search history.

(56) References Cited

U.S. PATENT DOCUMENTS

| | | | |
|---|---|---|---|
| 3,949,368 A | 4/1976 | West ............... 711/158 |
| 4,813,002 A | 3/1989 | Joyce et al. | |
| 4,928,260 A | 5/1990 | Chuang et al. | |
| 4,958,377 A | 9/1990 | Takahashi | |
| 5,319,589 A | 6/1994 | Yamagata et al. ......... 365/49 |
| 5,351,208 A | 9/1994 | Jiang ................. 365/49 |
| 5,386,413 A * | 1/1995 | McAuley et al. ......... 370/392 |
| 5,440,715 A | 8/1995 | Wyland ................. 711/108 |
| 5,485,418 A | 1/1996 | Hiraki et al. | |
| 5,515,370 A | 5/1996 | Rau ..................... 370/399 |
| 5,642,322 A | 6/1997 | Yoneda | |
| 5,818,786 A | 10/1998 | Yoneda | |
| 5,870,324 A | 2/1999 | Helwig et al. | |
| 5,920,886 A | 7/1999 | Feldmeier | |
| 5,999,435 A | 12/1999 | Henderson et al. | |
| 6,000,008 A | 12/1999 | Simcoe | |
| 6,006,306 A | 12/1999 | Haywood et al. | |
| 6,011,795 A | 1/2000 | Varghese et al. | |
| 6,081,440 A | 6/2000 | Washburn et al. | |
| 6,098,147 A | 8/2000 | Mizuhara | |
| 6,137,707 A | 10/2000 | Srinivasan et al. ......... 365/49 |
| 6,144,574 A | 11/2000 | Kobayashi et al. | |
| 6,154,384 A | 11/2000 | Nataraj et al. ........... 365/49 |

(Continued)

FOREIGN PATENT DOCUMENTS

EP 1063827 12/2000

(Continued)

OTHER PUBLICATIONS

Kobayashi et al, "A Processor Based High-Speed Longest Prefix Match Search Engine," IEEE, 2000, pp. 233-239.

(Continued)

*Primary Examiner*—Christian P. Chace
(74) *Attorney, Agent, or Firm*—William L Paradice, III

(57) ABSTRACT

A ternary content addressable memory device. The device includes a ternary CAM array segmented into a plurality of array groups, each of which includes a number of rows of ternary CAM cells. Each array group is assigned to a particular priority by storing the priority number for each array group in an associated storage element. Data entries are then stored in array groups according to priority.

36 Claims, 17 Drawing Sheets

U.S. PATENT DOCUMENTS

| | | | |
|---|---|---|---|
| 6,161,144 A | 12/2000 | Michels et al. | |
| 6,181,698 B1 | 1/2001 | Hariguchi | |
| 6,195,701 B1 | 2/2001 | Kaiserswerth et al. | 709/231 |
| 6,199,140 B1 | 3/2001 | Srinivasan et al. | 711/108 |
| 6,237,061 B1* | 5/2001 | Srinivasan et al. | 711/108 |
| 6,266,262 B1 | 7/2001 | Washburn et al. | |
| 6,289,414 B1 | 9/2001 | Feldmeier et al. | |
| 6,362,992 B1 | 3/2002 | Cheng | 365/49 |
| 6,370,613 B1* | 4/2002 | Diede et al. | 711/108 |
| 6,389,506 B1* | 5/2002 | Ross et al. | 711/108 |
| 6,418,042 B1* | 7/2002 | Srinivasan et al. | 365/49 |
| 6,460,112 B1* | 10/2002 | Srinivasan et al. | 711/108 |
| 6,499,081 B1* | 12/2002 | Nataraj et al. | 711/108 |
| 6,539,455 B1* | 3/2003 | Khanna et al. | 711/108 |
| 6,606,681 B1* | 8/2003 | Uzun | 711/392 |
| 6,892,237 B1* | 5/2005 | Gai et al. | 709/224 |
| 2001/0011228 A1* | 8/2001 | Shenkman | 705/14 |
| 2001/0053150 A1* | 12/2001 | Clear et al. | 370/392 |
| 2002/0161969 A1* | 10/2002 | Nataraj et al. | 711/108 |

FOREIGN PATENT DOCUMENTS

| | | |
|---|---|---|
| JP | 11-102589 | 4/1999 |
| WO | WO 01/11630 | 2/2001 |

OTHER PUBLICATIONS

Waldvogel et al, "Scalable High Speed IP Routing Lookups," SIGCOMM 1997, Cannes, France, pp. 25-35.

Waldvogel et al, "Scalable High-Speed Prefix Matching," ACM Transactions on Computer Systems, Nov. 2001, pp. 440-482.

Srinivasan et al, "Fast Address Lookups Using Controlled Prefix Expansion," ACM Transactions of Computer Systems, Feb. 1999, pp. 1-10.

Kobayashi et al, "A 50-Mpps Longest Prefix Match Search Engine LSI for Multi-gigabit IP Forwarding," Technical Report of IEICE, Nov. 1998, pp. 7-12.

Gupta et al, "Routing Lookups in Hardware at Memory Access Speeds," Proc. Infocom San Francisco, Apr. 1998.

Robinson, "Pattern Addressable Memory," IEEE Micro, Jun. 1992, pp. 20-30.

Huang et al, "A Fast IP Routing Lookup Scheme for Gigabit Switching Routers," IEEE 1999, pp. 1429-1436.

Huang, "A Novel IP-Routing Lookup Scheme and Hardware Architecture for Multigigabit Switching Routers," IEEE Journal on Selected Areas in Communications, Jun. 1999, pp. 1093-1104.

Hayashi et al, "High Speed Table Lookup Engine for IPv6 Longest Prefix Match," IEEE Global Telecommunications Conference, 1999, pp. 1576-1581.

Kobayashi et al, "A Longest Prefix Match Search Engine for Multi-Gigabit IP Processing," IEEE, 2000, pp. 1360-1364.

* cited by examiner

TERNARY CONTENT ADDRESSABLE MEMORY DEVICE

CROSS-REFERENCE TO RELATED APPLICATION

This application is a continuation-in-part, and claims the benefit under 35 USC §120, of co-pending and commonly owned U.S. patent application Ser. No. 09/829,355 entitled "CLASSLESS INTERDOMAIN ROUTING USING BINARY CONTENT ADDRESSABLE MEMORY" filed Apr. 9, 2001, incorporated by reference herein.

BACKGROUND

1. Field of Invention

This invention relates generally to semiconductor memories and specifically to content addressable memories.

2. Description of Related Art

Packets of data are relayed across the Internet according to an Internet Protocol (IP) addressing scheme. One commonly used IP addressing scheme is known as IPv4. An IPv4 address is a 32-bit binary address segmented into Network and Host address fields. IPv4 addresses are typically grouped into classes depending upon how many bits are in the Network field. For example, Class A, B, and C IPv4 addresses have 8-bit, 16-bit, and 24-bit Network fields, respectively. Due to static field boundaries, the classfull IPv4 addressing scheme generally results in inefficient use of address space.

A classless IP addressing scheme commonly known as Classless Inter-Domain Routing (CIDR) allows for a floating boundary between the Network and Host fields to more efficiently utilize address space. A CIDR address may be expressed as a standard 32-bit IPv4 address followed by a prefix Z, i.e., IPv4/Z, where the prefix Z indicates the number of bits in the Network field (and thus the prefix length of the CIDR address). For instance, a CIDR address of 168.69.48.112/12 has a 12-bit Network field and a 20-bit Host field.

For routing applications, CIDR addresses are typically stored in a searchable table such as a content addressable memory (CAM) device. A CAM device includes an array having a plurality of rows of CAM cells for storing a plurality of CAM words, e.g., CIDR addresses. During compare operations, a comparand word or search key is compared with all the CAM words in the device. For each CAM word that matches the comparand word, a corresponding match line signal is asserted to indicate the match condition. If the comparand word matches more than one of the CAM words, the match line corresponding to each of the matching CAM words is asserted, and a multiple match flag is also asserted to indicate the multiple match condition. The match line signals are typically provided to a priority encoder to determine the index or address of the highest-priority matching (HPM) CAM word.

For routing applications, it may be desirable to compare only the Network field portion of CIDR addresses stored in a CAM array with the search key. In such compare operations, the Host field portion of each CIDR address stored in the CAM array may be masked so that bits in the Host field portion do not participate in the compare operation. The Host field bits may be masked globally or locally.

In a binary CAM device, data entries stored in an array are masked by a global mask. The global mask stores a mask pattern that masks a predetermined number of bits of each entry in the array. Because addresses within a classfull IPv4 addressing scheme (e.g., Class A) each have the same prefix length, and thus the same number of Host field bits are to be masked during compare operations, binary CAM devices are useful for classfull IPv4 addressing schemes where all data entries have the same prefix.

However, binary CAM devices are not well suited for CIDR addressing schemes in which the CAM data entries may have different prefix lengths, and thus require individual masks of different lengths. During compare operations, it is generally desirable to determine which matching CAM entry is the "best match" or "longest prefix match" (LPM), that is, which matching CAM entry has the longest prefix, (i.e., the fewest number of masked bits). Because the global mask of a binary CAM device masks the same bits for each entry, numerous compare operations may be needed to determine the best match. For example, the global mask is initially set to not mask any bits for a first compare operation. If there is no match, the global mask is set to mask one column for a second compare operation, and so on until a match conditions occurs. The first compare operation that results in a match indicates the best match. Performing multiple compare operations per search key to determine the LPM requires considerable time, and therefore may limit performance.

A ternary CAM array includes a local mask word for each row of CAM cells so that each entry in the ternary CAM array may be individually masked according to its prefix. The ability to individually mask each entry eliminates the need for iterative compare operations per search key, thereby making ternary CAM devices well-suited for CIDR addressing schemes. In one scheme for CIDR address processing, the entries are pre-sorted in the ternary array such that entries with the longest prefix are stored at the highest priority locations (e.g., in the lowest CAM index), and entries with the shortest prefix are stored in the lowest priority locations (e.g., the highest CAM index). During a compare operation, a priority encoder generates the index of the highest-priority match, which is also the longest prefix match because of the ordering of the entries according to prefix length. Since the priority encoder determines the highest priority matching location based on predetermined address assignments, the ordering of entries in the ternary CAM array must be maintained in order to generate the correct results. The prioritizing of the word entries is typically performed by a table management hardware and/or software tool. Thus, when a new entry is written to the CAM array, the table management tool must re-order some or all of the entries in order to maintain proper ordering. The re-ordering of entries in the ternary CAM can add significant overhead to the associated router (e.g., delay and additional hardware and software) and may limit performance.

In other schemes for CIDR address processing in a ternary CAM, such as those described in U.S. patent application Ser. No. 09/338,452 entitled METHOD AND APPARATUS FOR DETERMINING A LONGEST PREFIX MATCH IN A CONTENT ADDRESSABLE MEMORY DEVICE and U.S. patent application Ser. No. 09/406,170 entitled METHOD AND APPARATUS FOR PERFORMING PACKET CLASSIFICATION FOR POLICY BASED PACKET ROUTING, entries may be stored in the ternary CAM array in any order (regardless of prefix length). Circuitry included within the ternary array itself or external to the ternary array can be used to resolve the longest prefix match.

Because each row of CAM cells in a ternary CAM array includes an additional row of mask cells to store the local mask, ternary CAM devices are generally not able to store as many unique CIDR addresses as binary CAMs.

It would be desirable to implement CIDR applications using binary CAM cells to achieve higher storage density without having to perform a lengthy sequence of compare operations for each search key, and to be able to add new CAM entries without having to re-order existing entries.

SUMMARY

A method and apparatus are disclosed that allow CIDR addressing schemes to be implemented using binary CAM cells without a multitude of compare operations per search key. In accordance with the present invention, a binary CAM array is segmented into a plurality of array groups, each of which includes a number of rows of binary CAM cells and an associated group global mask. Each array group may be assigned to a particular prefix length by storing a prefix mask pattern corresponding to the prefix length in the array group's associated group global mask. CIDR address entries are then stored in array groups assigned to corresponding CIDR prefixes so that an array group assigned to a particular prefix stores only CIDR addresses having that prefix.

In other embodiments of the present invention, a ternary CAM array is segmented into a plurality of array groups, each of which includes a number of rows of ternary CAM cells. Each array group is assigned to a particular priority by storing the priority number for each array group in an associated storage element. Data entries are then stored in array groups according to priority.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Present embodiments are discussed below in the context of a CAM system 100 for simplicity only. It is to be understood that present embodiments are equally applicable to other CAM architectures of various sizes and configurations. For example, although described below in the context of synchronous embodiments, the present invention may be readily practiced in asynchronous embodiments. Further, although compare and write operations for CAM system 100 are described below in the context of CIDR addresses, present embodiments may be used for applications other than CIDR addressing schemes. In addition, the particular logic levels assigned to signals discussed herein are arbitrary and, thus, may be reversed where desirable. Additionally, single signal lines may alternatively be multiple signal lines or busses, and multiple signal lines or busses may be single signal lines. Accordingly, the present invention is not to be construed as limited to specific examples described herein but rather includes within its scope all embodiments defined by the appended claims.

Figure 1:
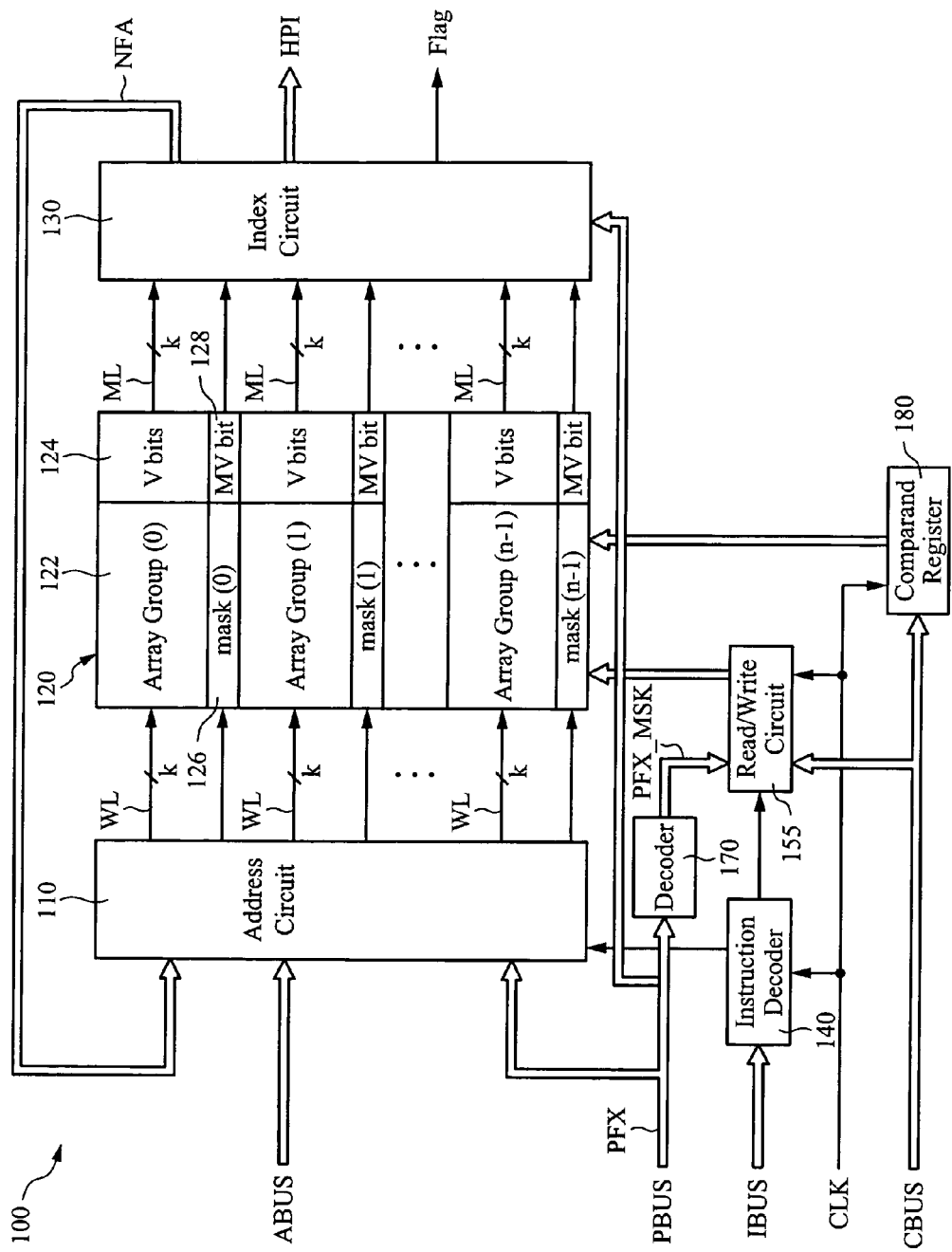
FIG. 1 is a block diagram of a CAM system having a CAM array segmented into a plurality of array groups in accordance with one embodiment of the present invention.

FIG. 1 shows a CAM system 100 in accordance with the present invention. CAM system 100 includes an address circuit 110, a CAM array 120, an index circuit 130, an instruction decoder 140, a read/write circuit 155, a decoder 170, and a comparand register 180. CAM array 120 is segmented into a number of groups 0 to n−1, each of which includes an array 122 and an associated group global mask 126. Each array group 122(0)–122(n−1) includes k rows of binary CAM cells for storing up to k data words such as, for example, the address portion of a CIDR address. For alternative embodiments, one or more of the array groups may have a different number of rows of CAM cells. Each row is coupled to a corresponding word line WL and a corresponding match line ML. The word and match lines for each array group 122(0)–122(n−1) are represented collectively in FIG. 1. Note that CAM system 100 may be also operate upon IPv6 addresses or store other types of data entries other than CIDR addresses.

Each array group 122 includes an extra column 124 of CAM cells for storing a valid bit (V bit) for each row in the array group 122. Each V bit indicates whether a valid word is stored in the corresponding row. Upon reset or power-up, the V bits are initially de-asserted to logic 1 so as to indicate that CAM array 120 is empty, i.e., that none of the rows in CAM array 120 contain valid data. When a word is written to a row of CAM array 120, its corresponding V bit may be asserted to logic 0 in a well-known manner to indicate that the row contains valid data. In some embodiments, each row of CAM array group 122 may include two or more V bits to distinguish between an empty row and a row which contains invalid data (and may indicate other states such as, for instance, a skip state).

Each group global mask 126(0)–126(n–1) stores a mask pattern that masks each data entry in the corresponding array group 122(0)–122(n–1). Each mask pattern represents the priority of the entries in the corresponding array groups relative to the entries in other array groups. Each array group may be assigned a unique priority number provided on the priority bus (PBUS), or may be assigned the same priority number as one or more other array groups. The mask patterns generated from the priority numbers (e.g., by decoder 170) are used to globally mask the entries in the corresponding array group during a comparison with a search key or comparand data provided from comparand bus CBUS and/or comparand register 180.

Each group global mask 126 includes an extra storage location 128 for storing a mask valid bit (MV bit) indicating whether a valid prefix mask pattern is stored in the corresponding group global mask 126. Upon reset or power-up, the MV bits are initially de-asserted to logic 1 so as to indicate that group global masks 126 are empty. When a mask pattern is written to a group global mask 126, its MV bit 128 may be asserted to logic 0 to indicate that the group global mask 126 contains a valid mask pattern, and also that the associated array group 122 is assigned to a corresponding priority number.

During compare operations, all matching entries (as masked by their group global masks) are reflected on the match lines of the respective groups and the match results provided to index circuit 130. Index circuit 130 determines the matching entry that has the highest priority number associated with it and generates the index or address of this highest priority matching entry (HPI). If there are multiple array groups that have matching entries and they have the same priority number, or if there are multiple matching entries within a single array group, index circuit 130 determines HPI based on which matching entry is stored in the lowest numerical address of array 120. For alternative embodiments, index circuit 130 may determine HPI based on entries stored in array 120 in other predetermined arrangements (e.g., at the highest numerical address). Index circuit 130 may also generate flag signals such a match flag signal, full flag signal, multiple match flag signal and the like.

Index circuit 130 may also generate the next free address (NFA) that is available in array 120 for storing a new data word. The NFA may be updated after each write operation to array 120. Address circuit 110 enables one of the word lines in response to NFA to select the free address in one of the array groups. As used in present embodiments, the NFA is the numerically lowest available CAM address that is assigned to a specified priority number assigned to one or more groups. For other embodiments, the NFA may be the numerically highest available CAM address for the specified priority number, or any other predetermined priority address. The NFA includes first and second address portions, where the first portion includes a number of most significant bits (MSBs) of the NFA that identifies the group address 0 to n−1 that is the address of the group global mask for an array group 122 assigned a particular priority number, and the second portion includes the remaining least significant bits (LSBs) of the NFA that identify the next free available row within the array group 122 having the particular priority number. The first and second portions of the NFA are hereinafter referred to as the group NFA (NFA_G) and the array NFA (NFA_A), respectively. For example, because there are n−1 array groups 122(0)–122(n−1) each having k rows of CAM cells, the NFA_G portions is $x=\log_2 n$ bits wide and NFA_A is $y=\log_2 k$ bits wide.

CAM system 100 includes instruction decoder 140 that receives instructions such as write, read, and compare instructions from an instruction bus IBUS and a clock signal CLK. In response thereto, the instruction decoder provides one or more control signals to address circuit 110, comparand register 180, and read/write circuit 155. Instruction decoder 140 may also provide other signals to the other circuits. For one embodiment, instruction decoder 140 may be a ROM or other type of control logic. Instruction decoder 140 may also include a timing generator to generate control signals at appropriate times relative to CLK.

For write and read operations, an explicit address may be provided to address circuit 110 via the address bus ABUS, or the NFA may be used to identify the intended group and row in array 120. In response to one or more control signals from instruction decoder 140, address circuit 110 accesses a row in one of the array groups by asserting its word line to an active state. Data may be written to or read from the accessed row by read/write circuit 155. Read/write circuit 155 also includes inputs to receive CLK and one or more control signals from instruction decoder 140. For one embodiment, read/write circuit 155 may output data to a results bus (not shown in FIG. 1) rather than to CBUS. For another embodiment, read/write circuit 155 may receive data from a data bus (not shown in FIG. 1) rather than from CBUS. Additionally, address circuit 110 may also select one of the group global masks for writing and reading priority numbers via read/write circuit 155. For one embodiment, ABUS may be eliminated, and the external address provided to address circuit 110 via CBUS. Address circuit 110 may include one or more decoders. Address circuit 110 may also include an NFA table (not shown in FIG. 1) that stores an NFA for each priority. As will be described in more detail below, each entry in the NFA table may be selected in response to an input priority number provided on the PBUS.

System 100 may operate as a CIDR processing system by storing the IP address portion of CIDR addresses in array 120. The remainder of this application will discuss CAM system 100, and its various embodiments, in the context of a CIDR processing system. However, system 100 may be used to store and operate upon any types of groups of data wherein each data group has an associated priority relative to the other groups.

Each array group 122(0)–122(n−1) that stores a CIDR address is assigned a priority number equal to its CIDR prefix. The prefix number PFX is provided on the PBUS and is decoded by decoder 170 to generate an equivalent prefix mask pattern PFX_MSK for the corresponding group global mask 126(0)–126(n−1). For example, the first array group 122(0) may be assigned to a prefix of 12 by storing a prefix mask pattern in group global mask 126(0) that will mask the 20 least significant (e.g., right-most) bits of entries stored in array group 122(0) during compare operations so that only the 12 most significant bits are compared with the search key. Once an array group is assigned to a prefix, only CIDR addresses having that prefix are stored in that array group. For example, if array group 122(0) is assigned to the prefix of 12, only CIDR addresses having a prefix of 12 are stored in array group 122(0). If array group 122(0) becomes full, then another available array group is also assigned to the prefix of 12. Thus, in accordance with the present invention, the prefix of a CIDR address is used to determine into which of array groups 122(0)–122(n−1) the corresponding IP address is written.

The array groups can be assigned any prefix in any order, and more than one array group may be assigned the same prefix. The prefix assigned to an array group indicates a relative priority of the entries within the array group as compared with the entries of the other array groups. For example, the array groups with the highest prefix numbers will have a higher priority than array groups with lower prefixes as the array groups with higher prefixes will have more unmasked bits. For alternative embodiments, priority may be reversed or otherwise determined.

The match lines of each array group are provided to index circuit 130 to determine the highest priority longest prefix match or best match from among the entries in CAM array 120 that match the input search key as masked by the prefix masks. For purposes of discussion herein, the first array group 122(0) includes the lowest CAM addresses (i.e., addresses 0 to k−1), array group 122(1) includes the next lowest CAM addresses (i.e., addresses k to 2k−1), and so on, and array group 122(n−1) includes the highest CAM addresses (i.e., addresses (n−1)k to nk−1). For alternative embodiments, the order of the addresses may be reversed or in another sequence. Index circuit 130 generates HPI as the address or index of the highest priority longest prefix match in array 120 in response to the match signals output by each of the array groups. For one embodiment, index circuit 130 includes a priority encoder that receives the match lines and encodes an address. The priority encoder may also determine an address amongst several matching entries that have the same longest prefix match using the relative numerical locations of the entries in array 120.

For one embodiment, each row in array groups 122(0)–122(n−1) includes 32 CAM cells to store a 32-bit IPv4 address, and each group global mask 126(0)–126(n−1) includes 32 storage locations to store a 32-bit prefix mask pattern. In other embodiments, each row in array groups 122(0)–122(n−1) may include any number of CAM cells, and group global masks 126(0)–126(n−1) may include any number of storage locations. In one embodiment, group global masks 126(0)–126(n−1) may include fewer storage locations than the number of CAM cells in each row each of CAM array 120.

Decoder 170 has an input to receive a prefix PFX on the PBUS, and in response thereto provides a decoded prefix mask pattern PFX_MSK to read/write circuit 155. The prefix PFX may be generated by external control logic in, for example, a router incorporating CAM system 100. PFX may be encoded to reduce the number of signal lines on PBUS, and then decoded by decoder 170 to generate PFX_MSK. Thus, if each global mask 126 has $2^m$ bits, then the PBUS may carry m encoded bits of prefix data. For one embodiment, where each group global mask 126 has 32 bits, PBUS carries 5 encoded prefix bits. Decoder 170 provides PFX_MSK to read/write circuit 155, which in turn provides PFX_MSK to one or more group global masks 126(0)–126(n−1).

For one example, a CIDR address with a binary encoded prefix of 11000, which corresponds to the decimal number 24, has a 24-bit prefix and, thus only its 24 left-most bits are to participate in compare operations. The encoded prefix 11000 may be decoded or expanded by prefix decoding logic 170 into 11111111 11111111 11111111 00000000 such that the 24 most significant bits are logic ones and 8 least significant bits are logic zeros. Decoder 170 (or other logic) may logically complement this data to form the prefix mask pattern of 00000000 00000000 00000000 11111111 such that the 24 most significant bits are logic zeros and 8 least significant bits are logic ones. This prefix mask pattern can be loaded into one or more of group global masks 126(0)–126(n−1). For this example, a logic zero mask bit indicates that corresponding bit locations in the associated array group 122 are not masked. For an alternate embodiment, a logic one mask bit may indicate that a corresponding bit location in the associated array group is not masked, and decoder 170 may not logically complement the mask data prior to loading it into group global masks 126.

As indicated above, index circuit 130 receives match information provided on k match lines ML from each array group 122(0)–122(n−1). Index circuit 130 also receives the V bits and MV bits from each array group 122(0)–122(n−1), and receives PFX from PBUS. The V bits may be provided over the match lines or, alternatively, over separate signal lines. Prefix assignment information for array groups 122(0)–122(n−1) is also provided to index circuit 130. For one embodiment, the prefix assignment information is provided to index circuit 130 from CAM array 120 by, for example, providing the prefix mask patterns stored in group global masks 126(0)–126(n−1) to index circuit 130. For another embodiment, index circuit 130 includes a table for storing prefix assignments for array groups 122(0)–122(n−1). In response to the match information and the prefix assignment information, index circuit 130 generates the index of the highest priority LPM (HPI).

Figure 2:
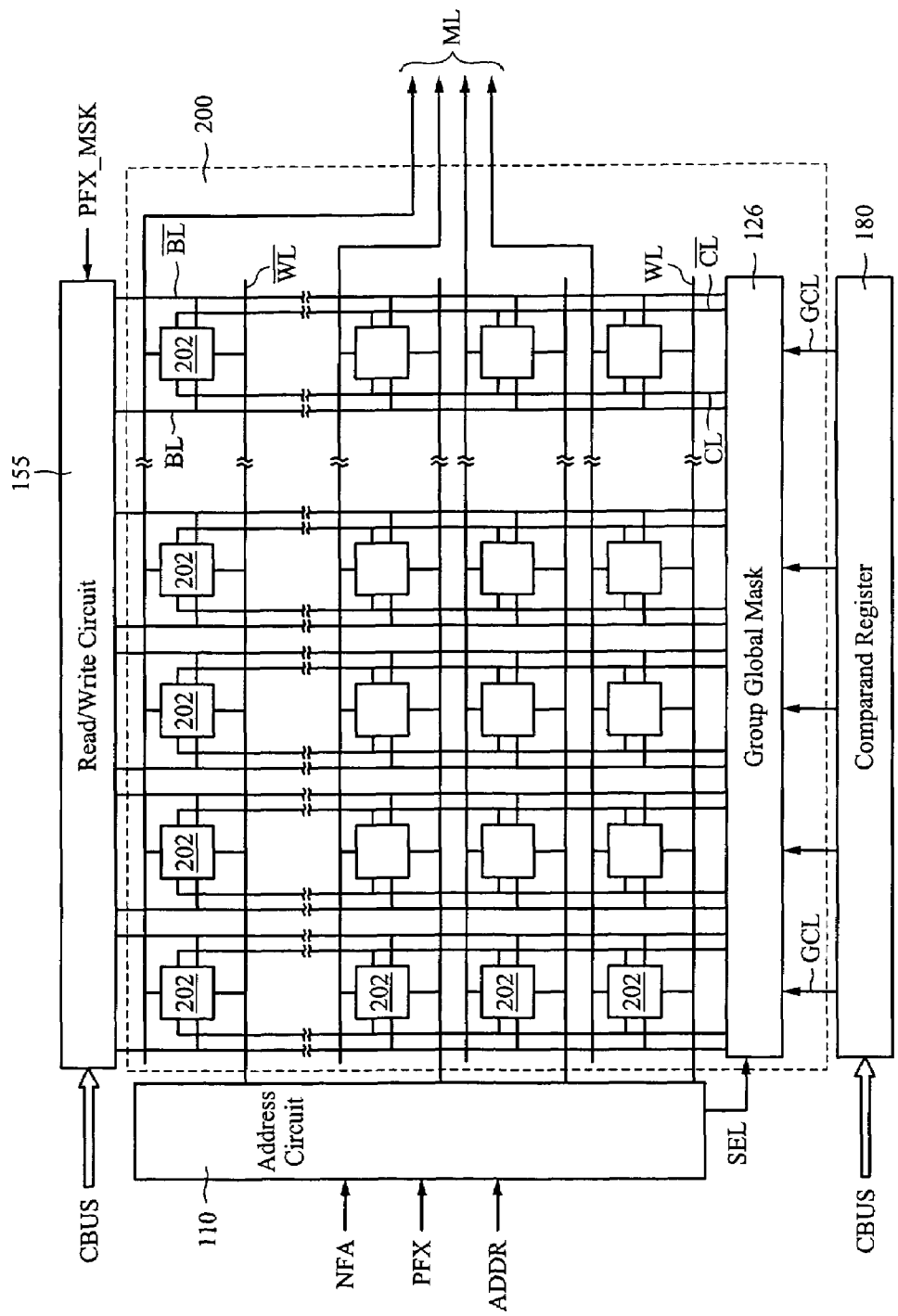
FIG. 2 is a block diagram of one embodiment of the array group of FIG. 1.

FIG. 2 shows array group 200 that is one embodiment of an array group 122 of FIG. 1. Array group 200 includes a plurality of CAM cells 202 and a corresponding group global mask 126, and is coupled to address circuit 110, read/write circuit 155, and comparand register 180. CAM cells 202 may be organized in any number of rows and columns, with each row coupled a match line ML and a word line WL. CAM cells 202 may be any well-known binary CAM cell. For simplicity, connections to CLK are not shown in FIG. 2.

The word lines WL are selectively driven by address circuit 110 in response to either ADDR or the NFA to select one or more rows of CAM cells 202 for read and/or write operations. Each match line ML indicates the match results of a compare operation for its corresponding row. A match line ML indicates a match condition for the row only if all unmasked CAM cells 202 in that row match the search key. In some embodiments, the match line ML is pre-charged for the compare operation. If any unmasked CAM cell 202 in the row does not match the search key, the CAM cell(s) 202 discharges the match line ML toward ground potential (e.g., logic 0) to indicate the mismatch condition. Otherwise, if all unmasked CAM cells 202 match the search key, the match line ML remains in a charged state (e.g., logic high) to indicate the match condition.

Each column of CAM cells 202 is coupled to a bit line BL, a complementary bit line $\overline{BL}$, a comparand line CL, and a complementary comparand line $\overline{CL}$. The bit lines BL and $\overline{BL}$ are coupled to read/write circuit 155, which in turn may enable data to be written to or read from a row of CAM cells 202 or the group global mask 126. Read/write circuit 155 is well-known, and may include write drivers or buffers to provide data to BL and $\overline{BL}$, and may include sense amplifiers to determine the logic states of BL and $\overline{BL}$. Comparand lines CL and $\overline{CL}$ are coupled to group global mask 126. Each group global mask 126(0)–126(n−1) is also coupled to comparand register 180 via global comparand lines GCL.

To write or read a PFX_MSK to selected array group 200, address circuit 110 selects the group global mask 126 associated with the selected array group 200 by asserting a corresponding select signal SEL in response to NFA or an external address ADDR, and read/write circuit 155 provides the prefix mask pattern PFX_MSK to, or reads it from, the group global mask over BL and $\overline{BL}$. Similarly, to write or read an entry in a row of array group 200, address circuit 110 selects the row of CAM cells associated with the selected array group 200 by asserting a corresponding WL in response to NFA or an external address ADDR, and read/write circuit 155 provides the entry to, or reads the entry from, the select row of CAM cells over BL and $\overline{BL}$.

For compare operations, comparand register 180 provides the search key from CBUS to group global mask 126 via global comparand lines GCL. In response to the prefix mask pattern stored therein, the group global mask 126 provides, via corresponding comparand lines CL and $\overline{CL}$, a selectively masked search key to the array group 200 for comparison with entries stored therein. For example, for each prefix mask bit indicating that the corresponding bit of entries in array group 200 is to be masked, group global mask 126 drives the corresponding comparand line pair CL and $\overline{CL}$ to the same predetermined state (e.g., logic 0) so that CAM cells 202 coupled thereto will indicate a match condition, irrespective of data stored therein. Conversely, for each prefix mask bit indicating that the corresponding bit of entries stored in array group 200 is not to be masked, group global mask 126 drives the corresponding comparand lines pair CL and $\overline{CL}$ in response to the corresponding search key bit. In this manner, the prefix mask pattern stored in group global mask 126 effectively masks word entries stored in associated array group 200.

In alternate embodiments, other CAM array architectures may be used. For example, in some embodiments, CAM array 200 may not include complementary comparand lines CL and $\overline{CL}$, in which case the complementary bit lines BL and $\overline{BL}$ may be coupled to comparand register 180 via group global mask 126 and be used to perform a compare operation as is generally known in the art. For other embodiments, only one of comparand lines CL and $\overline{CL}$ or bit lines BL and $\overline{BL}$ may be needed.

By segmenting CAM array 120 into a plurality of array group 122(0)–122(n–1), and assigning each array group 122(0)–122 (n–1) to a particular prefix, present embodiments are able to perform search operations for CIDR addressing schemes using binary CAM cell technology in a single compare operation, i.e., without having to perform a number of compare operations per search key in which the prefix mask pattern is incrementally changed in order to determine the LPM. Implementing CIDR applications using binary CAM cells, rather than ternary CAM cells, advantageously allows for greater storage density. Further, as described below, present embodiments allow new entries to be written into CAM array 120 without having to re-prioritize or re-order existing entries, thereby eliminating or reducing the overhead for table management hardware and/or software tools used to maintain a proper priority order for CIDR addresses.

For alternative embodiments, array 120 may be a CAM array of ternary CAM cells.

Compare operations to CAM array 120 are described below with respect to FIGS. 3 and 4. For simplicity, clock signals such as CLK are not shown in FIG. 3. For the discussion of the exemplary compare operation that follows, CAM array 120 is assumed to already have a number of IPv4 addresses stored in one or more of array groups 122(0)–122 (n–1) according to prefix length. Thus, one or more of array group 122(0)–122(n–1) is already assigned to a particular prefix, and associated group global masks 126(0)–126(n–1) already store corresponding prefix mask patterns. The array groups may be assigned prefixes in any order unrelated to their physical location in array 120. That is, the array groups do not have to be sorted in array 120 based on their prefixes.

Figure 3:
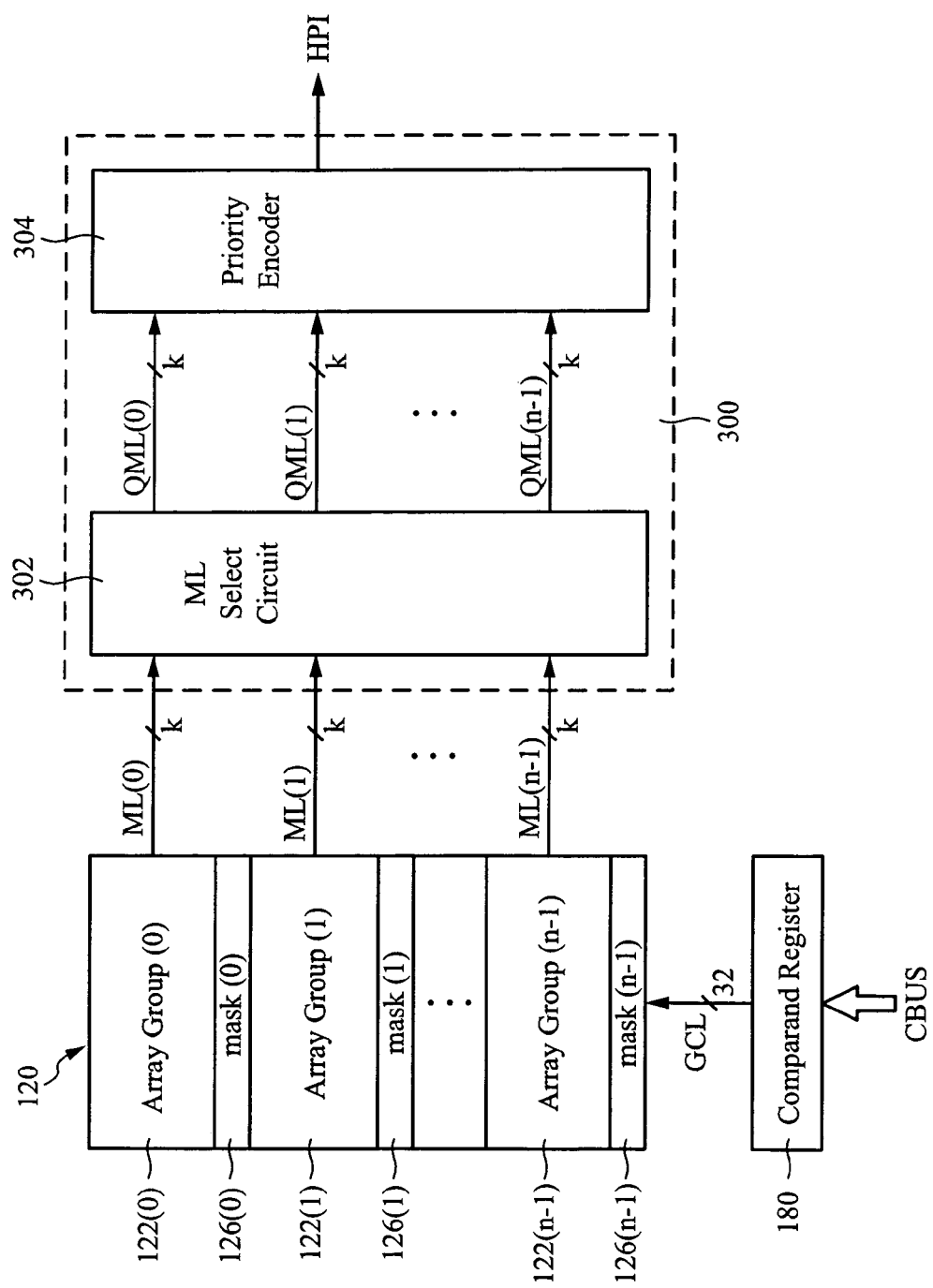
FIG. 3 is a block diagram of the CAM system of FIG. 1 including an exemplary embodiment of the index circuit of FIG. 1.

FIG. 3 shows an index circuit 300 that is one embodiment of index circuit 130 of FIG. 1. Index circuit 300 includes a match line (ML) select circuit 302 and a priority encoder 304. ML select circuit 302 has inputs to receive match information from array groups 122(0)–122(n–1) via match lines ML(0)–ML(n–1), and includes outputs to provide corresponding qualified match information to priority encoder 304 via qualified match lines QML(0)–QML(n–1). For one embodiment, ML select circuit 302 may include a table (not shown in FIG. 3) for storing prefixes for array groups 122(0)–122(n–1). Alternately, ML select circuit 302 may receive prefix information from group global masks 126(0)–126(n–1). Priority encoder 304 is well-known and, in response to the qualified match signals on lines QML, determines the index of the highest priority longest prefix match (HPI). For one embodiment, HPI is the lowest address value at which a matching entry is located, although in other embodiments priority may be reversed.

Figure 4:
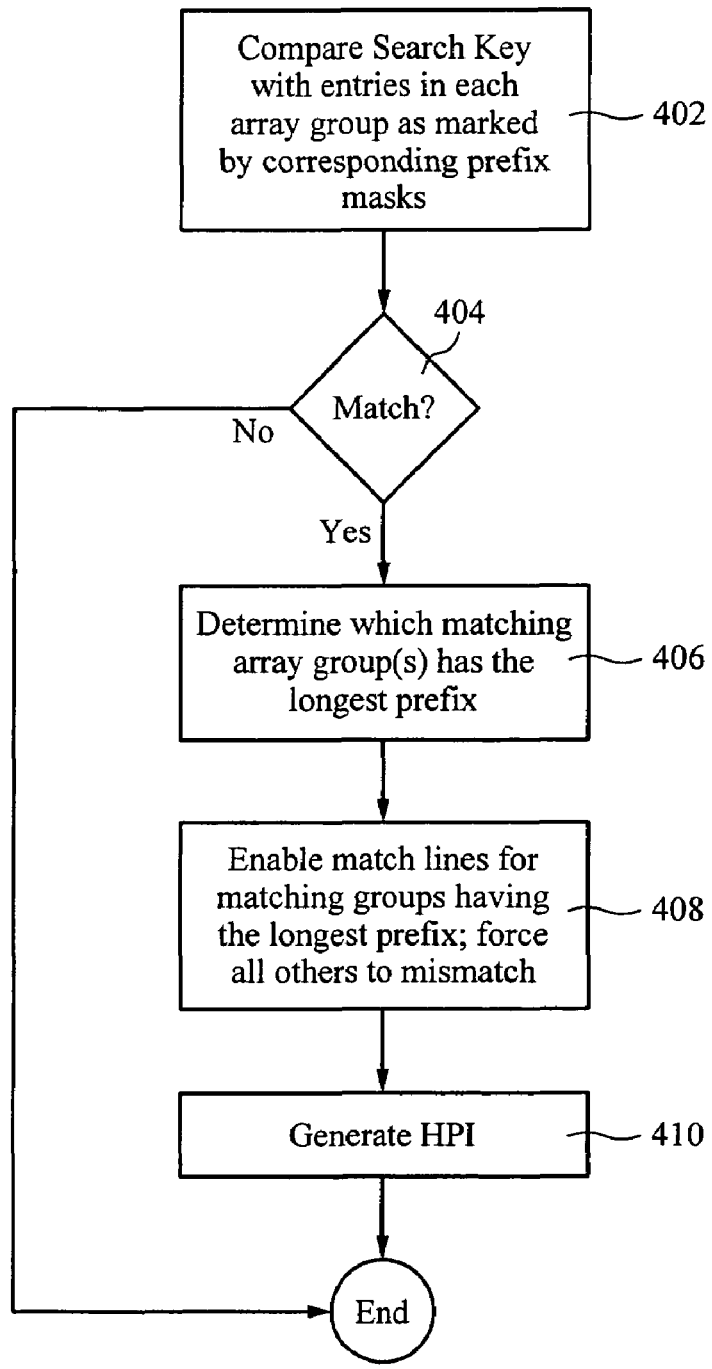
FIG. 4 is a flow chart illustrating one embodiment of a compare operation for the CAM system of FIG. 3.

Referring also to the flow chart of FIG. 4, during compare operations, a search key is provided to CAM array 120 and compared with entries stored in array groups 122(0)–122 (n–1) as masked by the prefix mask patterns stored in corresponding group global masks 126(0)–126(n–1) (step 402). For each matching entry, the corresponding match line ML is asserted to indicate the match condition. If there is a match in one or more array groups 122(0)–122(n–1), as tested in step 404, ML select circuit 302 uses the prefix assignments for array groups 122(0)–122(n–1) to select which of the array groups 122(0)–122(n–1) with one or more matching entries is assigned to the longest prefix (step 406) or highest priority. In response thereto, ML select circuit 302 qualifies or allows the match signals from the selected array group 122 to pass to priority encoder 304, and disqualifies the match signals from all other array groups 122 by, for instance, forcing their corresponding qualified match lines QML to a mismatch state (e.g., ground potential) (step 408). If more than one array group 122 is assigned the longest prefix, ML select circuit 302 enables the match signals from each such "matching" array group 122 to pass through to priority encoder 304. Priority encoder 304 then generates HPI in response to the qualified match signals on QML (step 410). Because only the match signals corresponding to the array group(s) 122 that have the longest prefix are considered by priority encoder 304, priority encoder 304 generates the appropriate HPI regardless of how the prefixes are assigned to the various array groups. That is, the array groups do not have to be sorted by prefix or physical location.

Figure 5A:
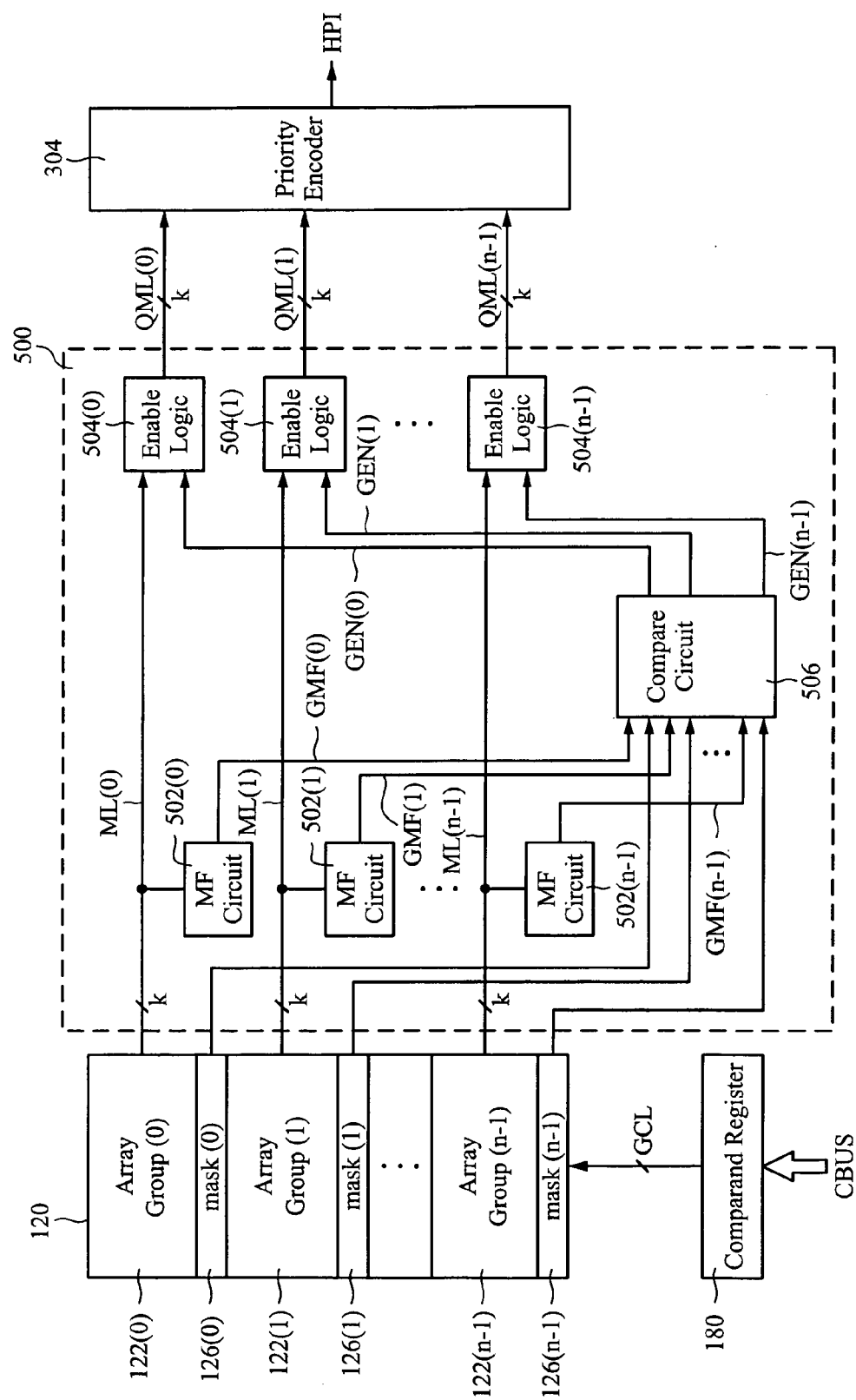
FIG. 5A is a block diagram of one embodiment of the select circuit of FIG. 3.

FIG. 5A shows a select circuit 500 that is one embodiment of select circuit 302 of FIG. 3. Select circuit 500 includes match flag circuits 502(0)–502(n–1), enable logic circuits 504(0)–504(n–1), and a compare circuit 506. Each match flag circuit 502(0)–502(n–1) is a conventional match flag circuit that receives match signals via match lines ML from a corresponding array group 122(0)–122(n–1) and, in response thereto, generates a corresponding group match flag GMF(0)–GMF(n–1), which are provided as inputs to compare circuit 506. The group match flags indicate whether there is at least one matching entry in the corresponding array group. Enable logic circuits 504(0)–504(n–1) each include first inputs to receive match signals via the match lines ML from a corresponding array group 122(0)–122(n–1), a second input to receive a corresponding group enable signal GEN(0)–GEN(n–1) from compare circuit 506, and outputs to provide corresponding qualified match signals QML(0)–QML(n−1) to priority encoder 304. For one embodiment, logic gates 504(0)–504(n−1) are AND gates that qualify or enable the match results to be provided to priority encoder 304 in response to GFN(0)–GEN(n−1).

For each group match flag that indicates a match, compare circuit 506 compares the prefix stored in the associated group global mask with the prefixes from the other array groups that have a matching entry (as indicated by their group match flags). Compare logic 506 then asserts to an active state the group enable signal associated with the array group that has a matching entry and has the longest (highest) prefix. If there is more than one array group with a matching entry that have the same longest prefix, then the group enable signals associated with all such array groups are activated. Compare circuit 506 deactivates all other group enable signals.

In response to GEN(0)–GEN(n−1), respective enable logic circuits 504(0)–504(n−1) either qualify (enable) or disqualify (disable) match signals from corresponding array groups 122(0)–122(n−1) to be provided to and considered by priority encoder 304 in generating HPI. For example, if GEN(0) is activated, which indicates that array group 122(0) has a match and is assigned to the longest prefix, logic gate 504(0) allows the match signals on match lines ML(0) to pass to priority encoder 304 as qualified match signals QML(0). Conversely, if GEN(0) is deactivated, which indicates that array group 122(0) either does not have a match or does not have a match with the longest prefix, logic gate 504(0) disqualifies the match signals on match lines ML(0) by forcing qualified match signals on QML(0) to a mismatch state.

The enable logic circuits may also be replaced with a multiplexer.

Figure 5B:
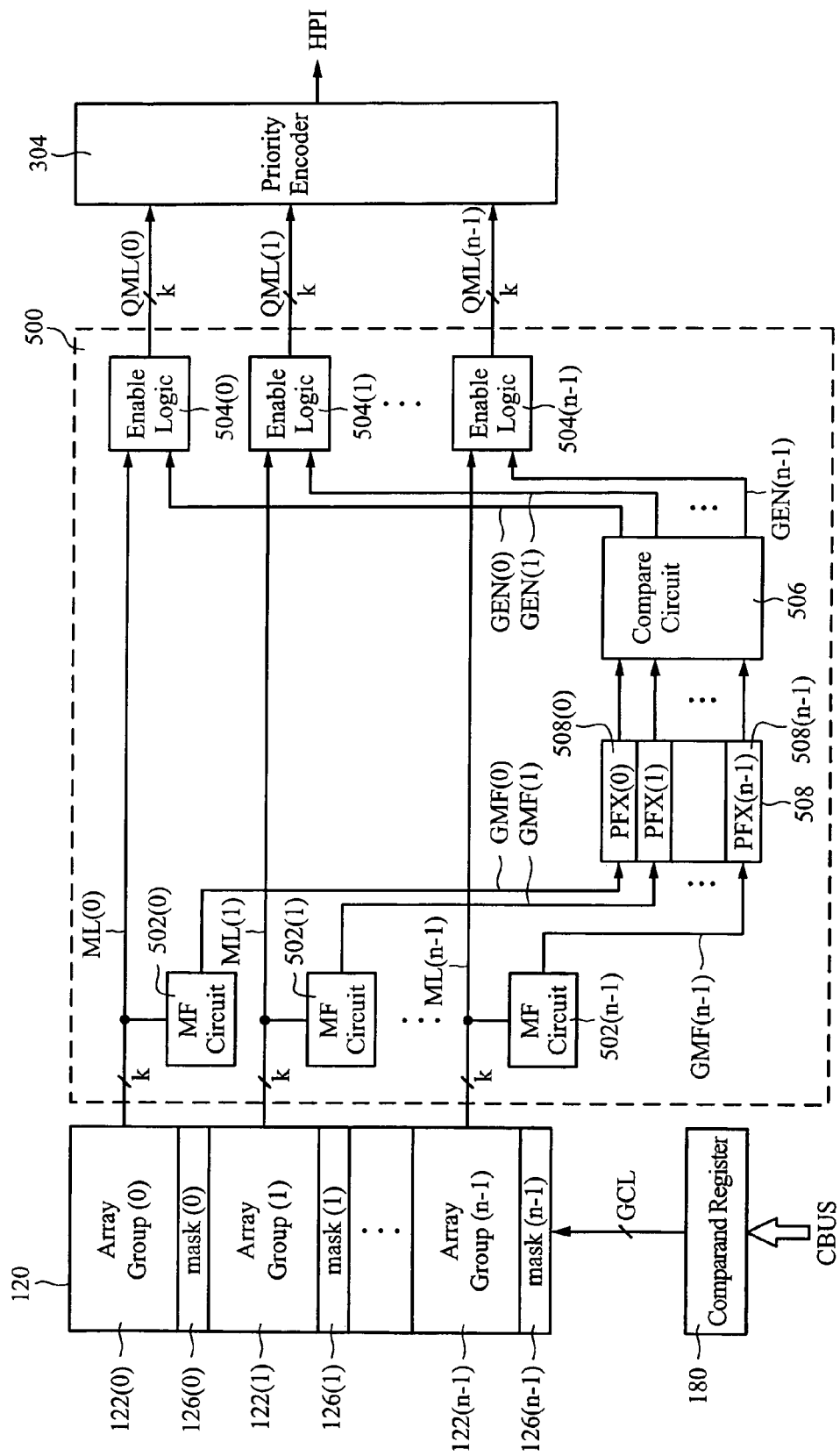
FIG. 5B is a block diagram of another embodiment of the select circuit of FIG. 3.

FIG. 5B shows an alternative embodiment of select circuit 500 of FIG. 5A. In this embodiment, compare circuit 506 does not receive the prefixes from the group global masks themselves; rather, table 508 is programmed with the corresponding prefixes PFX(0)–PFX(n−1). As shown, table 508 stores prefixes PFX(0)–PFX(n−1) in rows 508(0)–508(n−1), respectively, for corresponding array groups 122(0)–122(n−1). Table 508 may be programmed at the same time that the prefixes are written into the group global masks, at reset, upon initialization, or at any other time. The compare circuit 506 operates as in FIG. 5A in which the group match flags indicate which programmed prefixes are compared with each other to determine the group enable signals.

As in FIG. 5A, the enable logic circuits may be replaced with a multiplexer.

Figure 6:
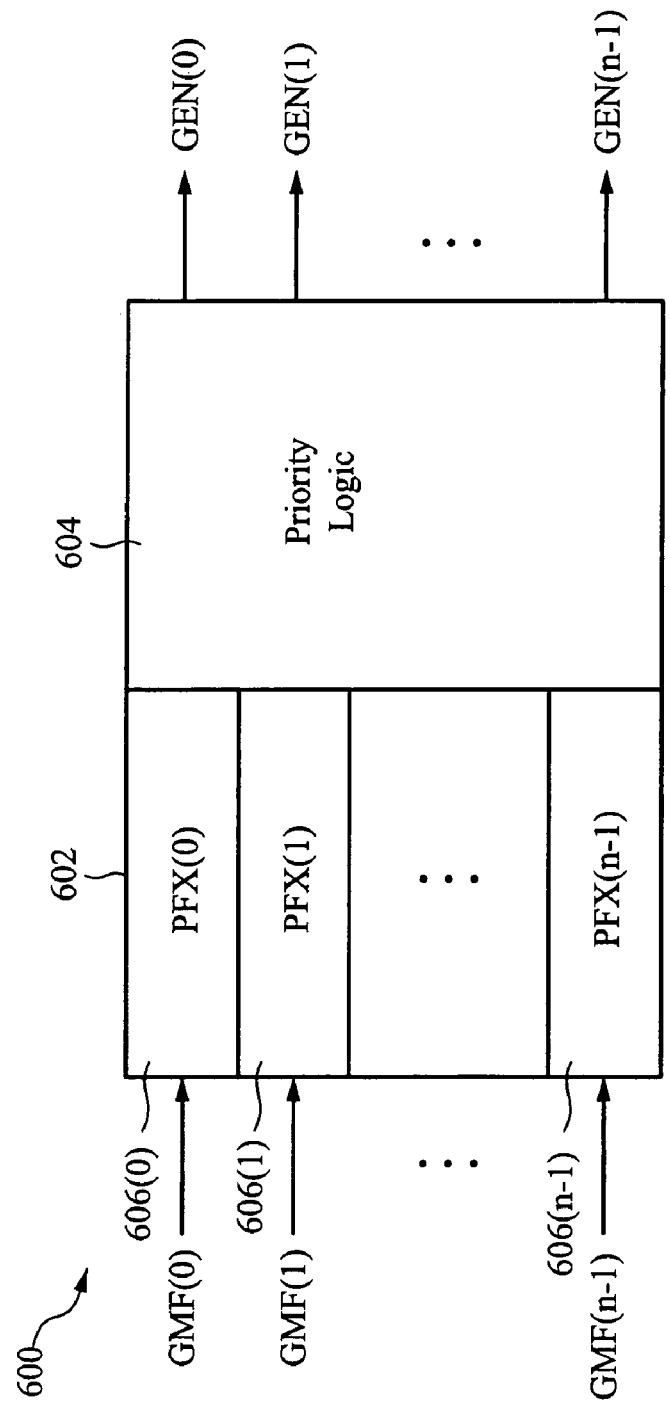
FIG. 6 is a block diagram of one embodiment of the table and compare circuit of FIG. 5B.

FIG. 6 shows a priority table 600 that is one embodiment of table 508 and compare circuit 506 of FIG. 5B. Priority table 600 includes a priority memory 602 and priority logic 604. Priority memory 602 is one embodiment of table 508 and includes n−1 rows 606(0)–606(n−1) each for storing a prefix PFX for a corresponding array group 122(0)–122(n−1). For example, row 606(0) stores the prefix PFX(0) assigned to array group 122(0). The prefixes may be stored in memory 602 in an encoded form. Each row 606(0)–606(n−1) receives a corresponding group match flag GMF(0)–GMF(n−1) that enables the corresponding prefix to be compared with the other prefixes. Priority memory 602 may be any type of memory array including volatile, non-volatile, random access memory (RAM), and/or read only access memory (ROM). For one embodiment, priority memory 602 comprises a CAM array. Priority memory 602 may be p bits wide to accommodate $Z=2^p$ entries, where p is any number.

For one embodiment, priority memory 602 is 5 bits wide to accommodate up to $2^5=32$ prefixes, as shown in the embodiment of FIG. 6.

Priority logic 604 is one embodiment of compare circuit 506 and compares the prefixes PFX(0)–PFX(n−1) corresponding to array groups 122(0)–122(n−1) that have a match, as indicated by respective signals GMF(0)–GMF(n−1), with each other to determine which matching array group 122 has the longest prefix, and in response thereto selectively asserts one or more of signals GEN(0)–GEN(n−1) so that only the match signals from matching array groups 122 that have the longest prefix are considered by priority encoder 304. A more detailed discussion of priority table 600, as well as other exemplary embodiments thereof, may be found in co-pending and commonly owned U.S. patent application Ser. No. 09/406,170 entitled METHOD AND APPARATUS FOR PERFORMING PACKET CLASSIFICATION FOR POLICY BASED PACKET ROUTING, which is incorporated by reference herein.

The prefixes PFX(0)–PFX(n−1) may be written into priority memory 602 in any suitable manner. For one embodiment, when address decoder 114 selects one of group global masks 126(0)–126(n−1) to store a prefix mask pattern for a particular prefix PFX, address decoder 114 may also select a corresponding row 606 in priority memory 602 so that the prefix PFX may be written thereto. For this embodiment, priority table 600 may include an input to receive PFX.

Figure 12:
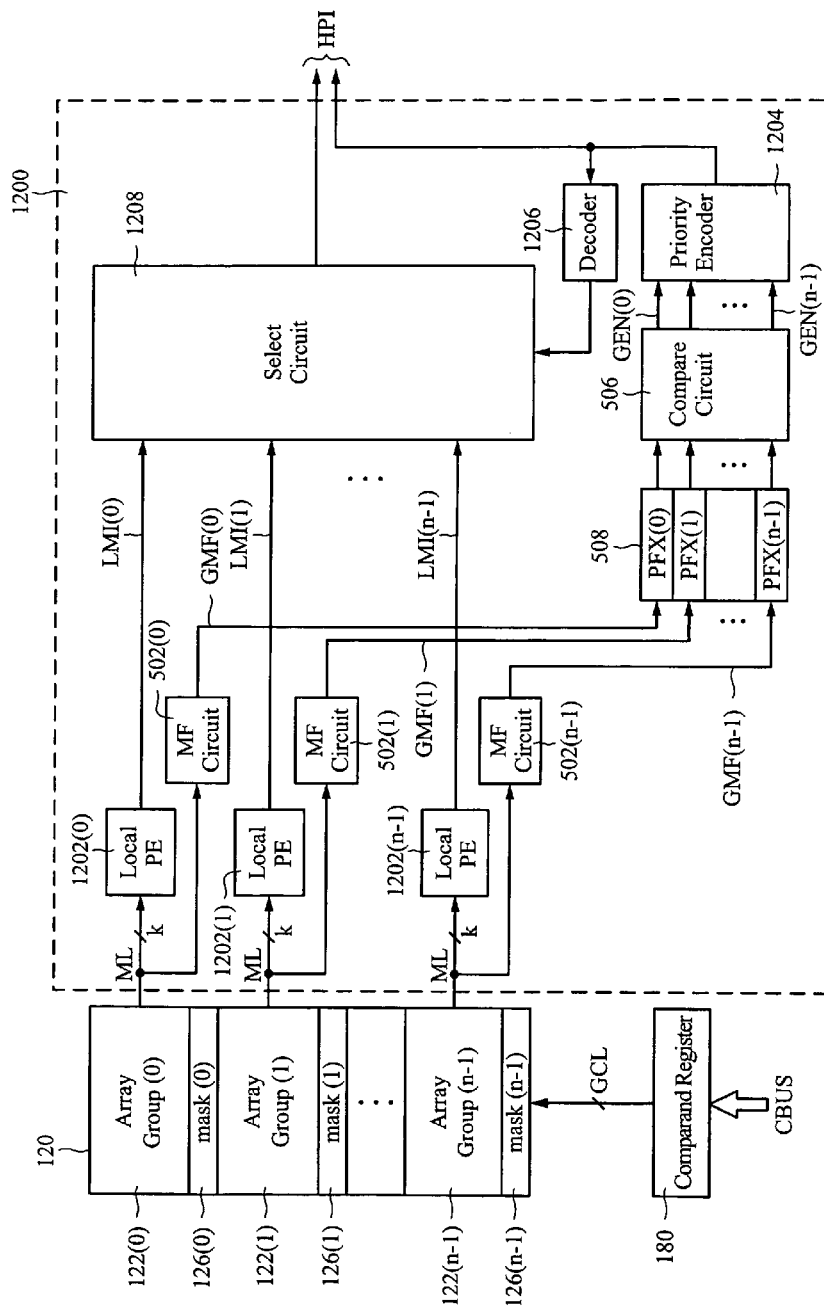
FIG. 12 is a block diagram of another embodiment of the index circuit of FIG. 1.

FIG. 12 shows index circuit 1200 that is another embodiment of index circuit 130 of FIG. 1. Index circuit 1200 includes the match flag circuits 502(0)–502(n−1) for each array group as in the embodiments of FIGS. 5A and 5B, and table 508 and compare circuit 506 as in FIG. 5B. In addition, each array group 122(0)–122(n−1) has its match lines coupled to provide its match results to local priority encoders 1202(0)–1202(n−1), respectively. In response to a compare operation, the local priority encoders determine local match indices LMI(0)–LMI(n−1) that each indicate the highest priority match (if any) within a particular group. Only those groups that have the same priority as the search key will output valid local match indices if they have a match. Otherwise, they may output a default state. The local match indices are then provided to select circuit 1208. Select circuit 1208 outputs one of the local match indices as the least significant bits of HPI in response to an input from decoder 1206 that indicates which array group(s) has the same priority as the input search key. If more than one array group is assigned the same prefix and the search key has a match, select circuit 1208 will select the local match index from the array group having the lowest numerical addresses. For alternative embodiments, the array group having the highest numerical addresses may be selected, or other predetermined orders may be used. Select circuit may be one or more multiplexers or equivalent circuitry.

The input to select circuit 1208 from decoder 1206 is determined, for example, as follows. The match flag circuits determine if a particular array group has a match. If so, the match flag circuit activates its group match flag. An activated group match flag enables the prefix for the corresponding array to be compared by compare circuit 506 with other prefixes from other arrays that also have a match. For each prefix entry in table 508, compare circuit 506 generates a GEN signal. The GEN signals are then encoded by priority encoder 1204 to determine the most significant bits of HPI. The most significant bits are also decoded by decoder 1206 to select one of the local match indices.

For alternative embodiments of FIG. 12, the MV bits may be multiplexed with the GMF signals as enable inputs to table 508 based on the operation. For example, during a compare operation the GMF signals may be provided to table 508 as described above, and during NFA operations, the MV bits may be provided to table 508. Additionally, for the NFA operation, the V bits may be provided to the local priority encoders and their outputs provided to select circuit 1208. This alternative may also be used for the embodiments of FIGS. 3, 4, 5A, and 5B.

With reference again to FIG. 1, as described above, new entries are written into an array group having the same prefix or priority number as the new entry. After a new entry has been written to an array group the index circuit 130 generates a new NFA for that particular prefix. The new NFA may be in the same array group if there are still available entries in the group (i.e., it is not full yet). However, if the last write operation filled the array group, then a new available array group can be assigned to the corresponding prefix and the NFA for that prefix assigned to indicate an address in the new array group.

Figure 7:
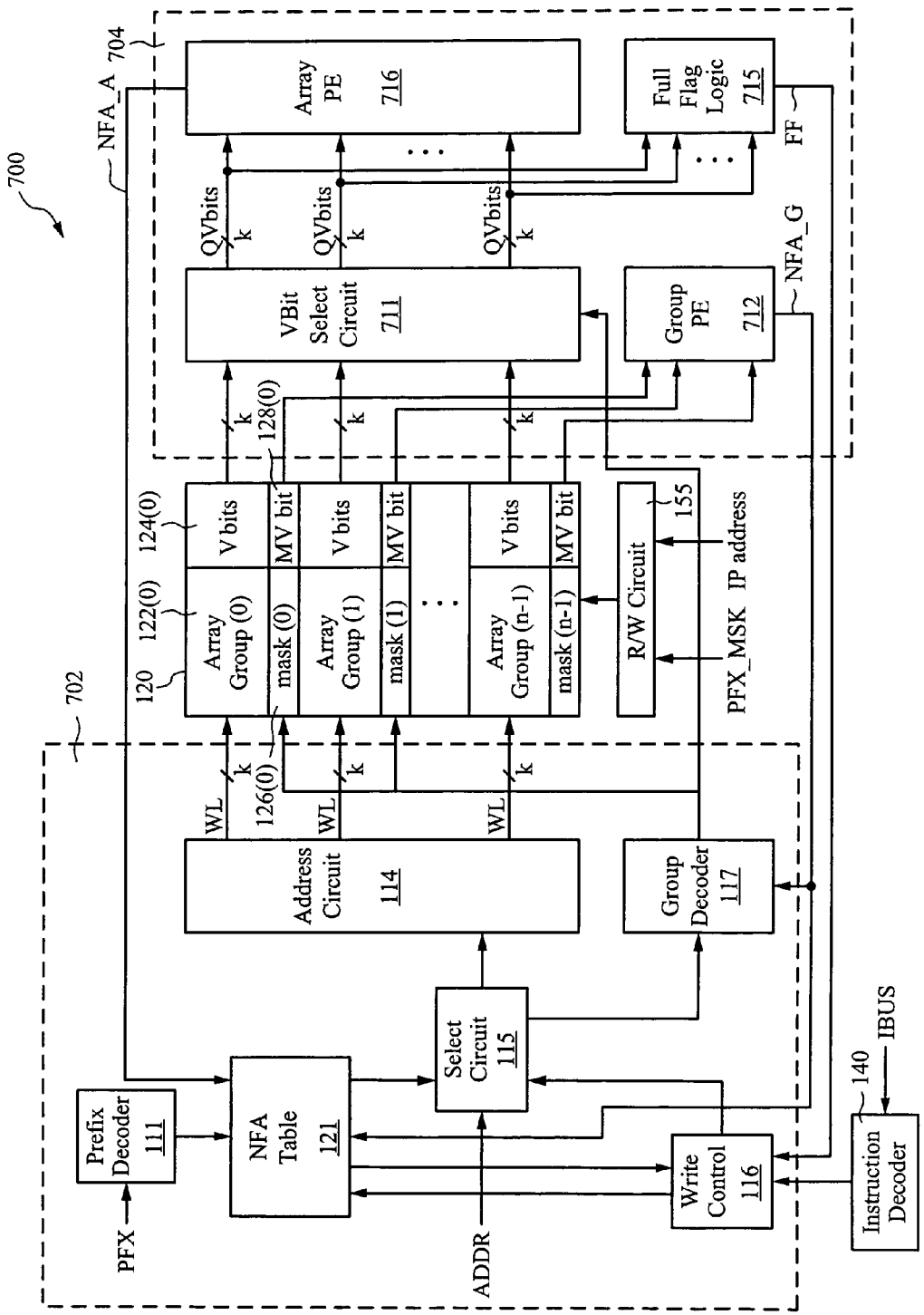
FIG. 7 is a block diagram of the CAM system of FIG. 1 including exemplary embodiments of the address circuit and index circuit of FIG. 1.

FIG. 7 shows one embodiment of the address circuit and index circuit of FIG. 1 for updating the NFAs associated with assigned prefixes or priority numbers in array 120. For simplicity, clock signals such as CLK are not shown in FIG. 7. Address circuit 702 is one embodiment of address circuit 110 of FIG. 1, and includes a prefix decoder 111, an NFA table 112, an array decoder 114, a group decoder 117, a select circuit 115, and write control circuit 116. Prefix decoder 111 has an input to receive a prefix PFX from the PBUS, and in response thereto provides decoded signals to NFA table 112. NFA table 112 has inputs to receive NFA_A from array priority encoder (PE) 716 and NFA_G from group priority encoder (PE) 712, and outputs to provide a selected NFA (e.g., NFA_G plus NFA_A) to select circuit 115 in response to one or more control signals from instruction decoder 140. Instruction decoder 140 provides the one or more control signals to NFA table 112 in response to receiving a write instruction on the IBUS. Select circuit 115 also receives ADDR and one or more control signals from write control circuit 116. The control signals from write control circuit 116 indicate whether select circuit 115 should provide information from NFA table 112 or ADDR to address decoder 114 or group decoder 117 to select a WL of a row of CAM cells or group global mask, respectively, in array 120 for writing or reading. For one embodiment, select circuit 115 is one or more multiplexing circuits.

Figure 8:
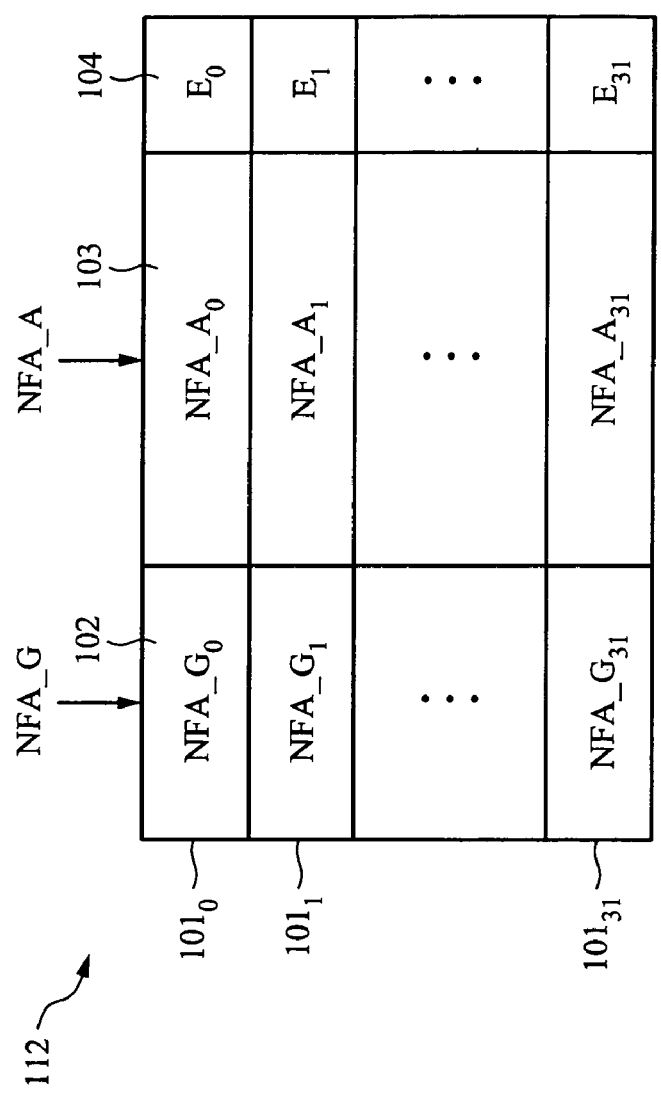
FIG. 8 is a block diagram illustrating one embodiment of the NFA table of FIG. 7.

Referring also to FIG. 8, NFA table 112 includes 32 rows $101_0$–$101_{31}$, although in other embodiments NFA table 112 may include any number of rows 101. Each row 101 of NFA table 112 stores the NFA in array 120 for a particular prefix, where the logical address of each row 101 indicates the prefix length. For example, row $101_0$ stores the NFA for PFX=0, row $101_1$ stores the NFA for PFX=1, and so on. Each row 101 of NFA table 112 includes a first field 102 to store an NFA_G for the prefix stored in the row, a second field 103 to store an NFA_A for the prefix stored in the row, and a third field 104 to store an empty or valid bit (E bit) indicating whether there is an NFA calculated for the prefix (and thus whether an array group 122 has been assigned to the prefix). Initially, the E bits 104 are set to logic 0 to indicate that there are no NFA entries stored in corresponding rows 101 of NFA table 112. An E bit will be updated to a logic 1 if a new entry is written into array 120 that has an associated prefix that was not previously assigned to an array group. The use of NFA table 112 and the other elements of address circuit 702 will be described in further detail below.

For an alternative embodiment, prefix decoder 111 may be omitted and each prefix may be stored in CAM cells in NFA table 112. For this embodiment, when a new entry is presented for writing in array 120, its associated PFX may be compared with the entered prefixes in the NFA table, and the corresponding NFA read from the matching entry.

Index circuit 704 is one embodiment of index circuit 130 of FIG. 1, and is shown to include a Vbit select circuit 711, a group priority encoder 712, an array priority encoder 716, and full flag logic 715. Full flag logic 715 and priority encoders 712 and 716 are well-known. Vbit select circuit 711 includes inputs to receive the V bits from rows of CAM cells in each array group 122(0)–122(n-1).

In response to the V bits and corresponding prefix assignment information, select circuit 711 provides qualified valid bits (QV bits) to array priority encoder 716 and full flag logic 715. For one embodiment, the prefix assignment information may be stored in a table (not shown in FIG. 7) within Vbit select circuit 711. In response to the QV bits, full flag logic 715 generates a full flag signal FF to indicate a full condition for array groups 122(0)–122(n-1) having a specified prefix. For one embodiment, FF is asserted to logic 1 to indicate the full condition, and de-asserted to logic 0 to indicate a not full condition. The full flag signal may be provided to write control logic 116. Also, in response to the QV bits, priority encoder 716 generates NFA_A for a corresponding prefix. Group priority encoder 712 has inputs to receive a mask valid bit (MV bit) from each group global mask 126(0)–126(n-1) and, in response thereto, generates the group next free address NFA_G. NFA_G and NFA_A may be loaded into NFA table 112 under the control of write control circuit 116 as will be described below. Additionally, NFA_G may be provided to group decoder 117 in order to access one or more of the group global masks and/or prefix data that may be stored in Vbit select circuit 711.

Figure 9:
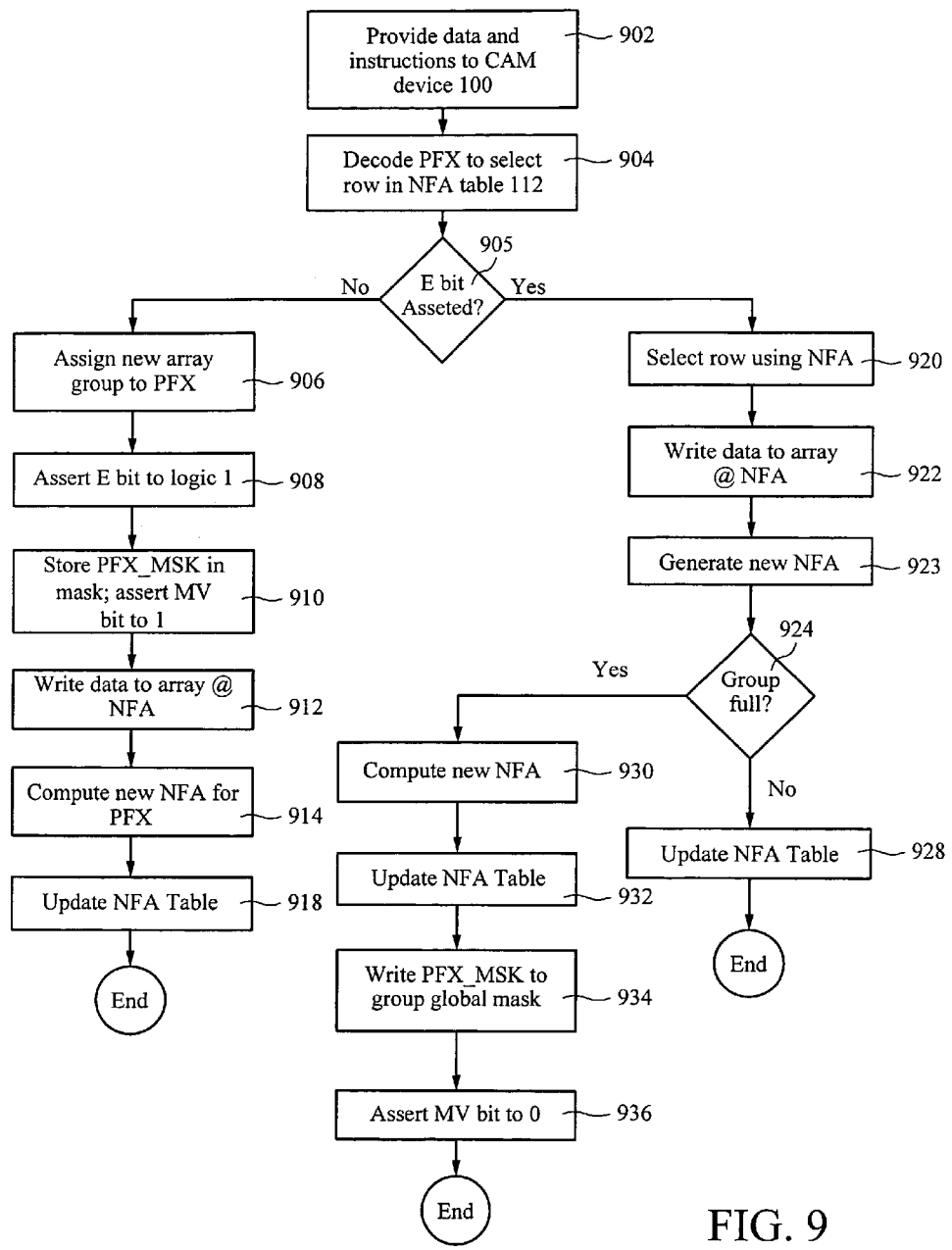
FIG. 9 is a flow chart illustrating one embodiment of a write operation for the CAM system of FIG. 7.

FIG. 9 is flow chart illustrating one embodiment of writing a new entry to array 120 and updating the NFA for the prefix associated with the entry. At step 902, a write instruction is provided to instruction decoder 140 via IBUS, the IP address is supplied to read/write circuit 155, and the prefix PFX for the IP address is provided to prefix decoder 111 and to decoder 170. Prefix decoder 111 decodes PFX and selects a corresponding row 101 of NFA table 112 (step 904). The E bit 104 for this row is provided to write control circuit 116. If the E bit for the selected row is not asserted (e.g., E=0), as tested in step 905, thereby indicating that there is not an array group 122 already assigned to PFX, one of the available array groups is assigned PFX (step 906) if array 120 is not full. Specifically, index circuit 130 computes an NFA for PFX, and the new NFA is stored in the selected row 101 of NFA table 112. Since NFA_G indicates the next free group, the new NFA is determined by group priority encoder 712 generating NFA_G from the MV bits of the array groups, and write control circuit 116 sending a control signal to NFA table 112 to load NFA_G into its selected row 101. The NFA_A portion of the selected row may be written to all zeros to indicate the first available address in this newly opened array group. The corresponding E bit 104 in the selected row in NFA table 112 is then asserted to logic 1 (step 908).

The new entry and its associated prefix mask are then written into array 120 as follows. Group decoder 117 decodes NFA_G to select the appropriate group global mask for writing the PFX_MSK of the new entry, and the corresponding MV bit is asserted to logic 1 (step 910). The new NFA stored in the selected row 101 is then provided to array decoder 114. In response thereto, array decoder 114 enables the corresponding word line of the selected array group 122 and the new entry is written into the selected array group (step 912). For one embodiment, the IP address and PFX_MSK may be simultaneously written into the selected array group 122 and group global mask 126, respectively. For other embodiments, the IP address and PFX_MSK may be written into CAM array 120 sequentially.

Figure 10:
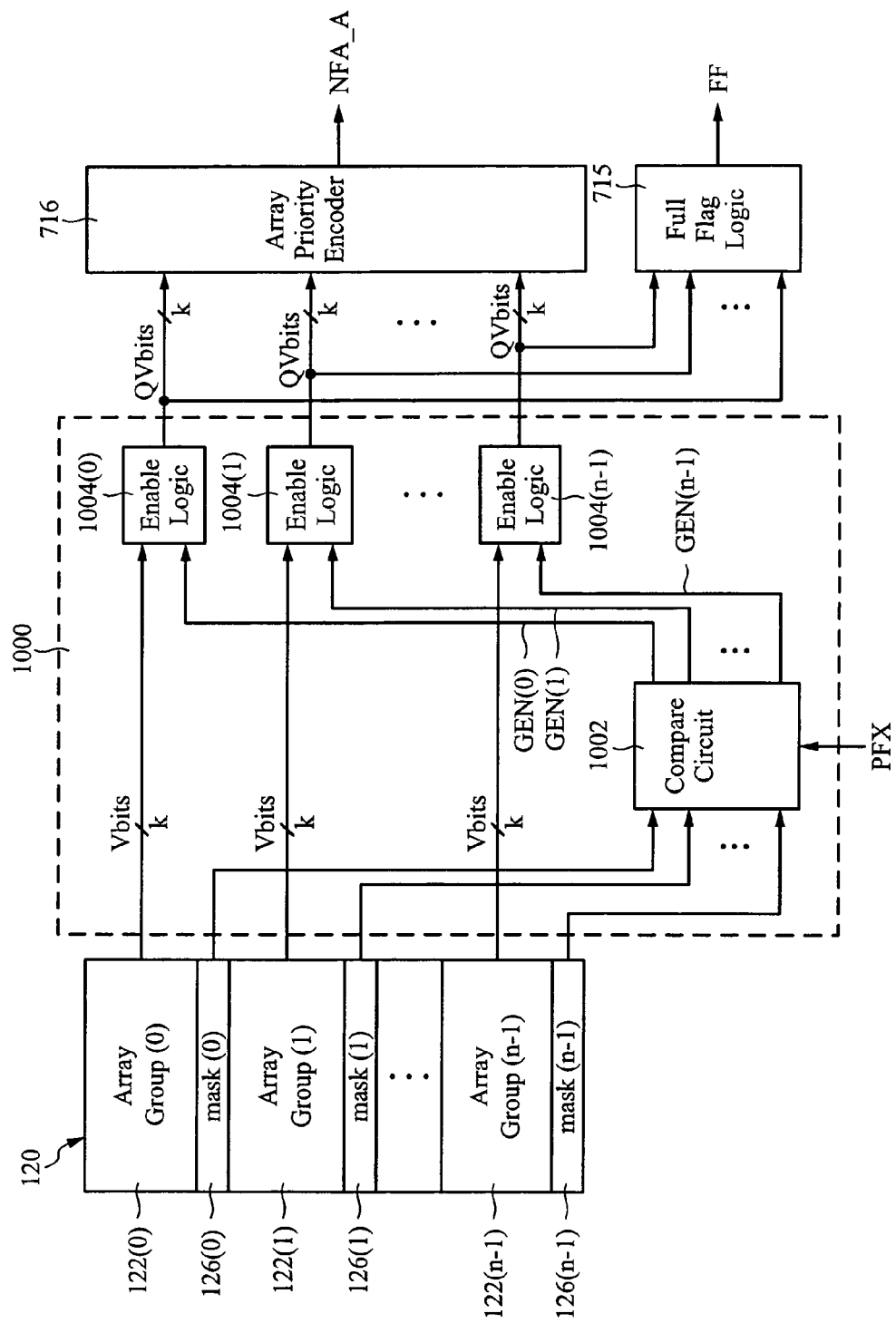
FIG. 10 is a block diagram of one embodiment of the select circuit of FIG. 7.

After the new entry has been written to array 120, index circuit 130 computes a new NFA for the selected array group 122 (step 914). The new NFA is determined by generating NFA_A from array priority encoder 716 for the associated prefix as will be described below with respect to FIG. 10. NFA_A is then written into the selected row of NFA table 112 (step 918).

If the E bit of the selected row 101 of NFA table 112 is already asserted to logic 1 at step 905, thereby indicating that an array group 122 is already assigned to PFX, the NFA stored in the selected row 101 is provided to array decoder 114 to select a row in the corresponding assigned array group 122 (step 920). The IP address is then written into the row of the array group selected by the NFA (step 922) and its V bit updated. Vbit select circuit 711 forwards the V bits of the selected array group 122 as qualified valid bits (QV bits) to full flag logic 715 and to array priority encoder 716. In response thereto, array priority encoder 716 generates a new NFA_A (step 923), which is provided to NFA table 112, and full flag logic 715 determines whether the selected array group 122 is full, and generates FF accordingly (step 924). If the selected array group 122 is not full, as determined in step 924, FF remains de-asserted to logic 0, and the new NFA_A is written to the selected row 101 of NFA table 112 under the control of write control circuit 116, thereby updating NFA table 112 for the prefix (step 928). For an alternative embodiment, step 924 may precede step 923, and step 923 may be executed if an array group is not full.

If, on the other hand, the selected array group 122 becomes full after the write operation (step 922), full flag logic 715 asserts FF to logic 1, and index circuit 130 generates a new NFA that identifies a row in a next available array group 122 for PFX (step 930). Specifically, group priority encoder 712 generates a new NFA_G for the PFX in response to the MV bits and provides the NFA_G to NFA table 112. In response to the de-asserted FF, write control circuit 116 causes NFA_G to be written into the selected row of NFA table 112 and the NFA_A portion of the table to reset to all zeros (step 932). Then, the PFX_MSK corresponding to PFX is written into the group global mask 126 associated with the next available array group 122 (step 934), and its corresponding MV bit is asserted (step 936), thereby assigning the next available array group 122 to PFX.

For an alternative embodiment of the process described in FIG. 9, each array group may be initially assigned a prefix number at reset or initialization. NFA table 112 may also be updated accordingly. For this embodiment, steps 906 through 918 may not be needed. For this example, the E bits may not be needed for NFA table 112.

Note that the process of FIG. 9 opens a new array group after a write results in a full condition for an array group of a particular prefix number. For an alternative embodiment, an array group does not need to be automatically opened; rather, when a new write operation is received, the current array group assigned to the prefix of the new entry is checked to determine if it is full. If so, a new array group is opened for the prefix and the new entry and prefix written (and new NFA generated). If not, then new entry is written (and new NFA generated).

Index circuit 704 uses Vbit select circuit 711 to generate qualified V bits for array priority encoder 716 for generating NFA_A, and for full flag logic 715 for generating FF. One embodiment of Vbit select circuit 711 is shown as Vbit select circuit 1000 in FIG. 10. Select circuit 1000 includes a compare circuit 1002 and a plurality of enable logic circuits 1004(0)–1004(n–1). Compare circuit 1002 includes an input to receive PFX, inputs to receive the prefixes stored in the group global masks, and outputs to provide group enable signals GEN(0)–GEN(n–1). Enable logic circuits 1004(0)–1004(n–1) each include first inputs coupled to receive the V bits from a corresponding array groups 122(0)–122(n–1), a second input to receive a corresponding group enable signal GEN(0)–GEN(n–1) from compare circuit 1002, and outputs to provide corresponding QV bits to priority encoder 716. For one embodiment, enable logic circuits 1004(0)–1004(n–1) are AND gates that qualify or enable the V bits to be provided to priority encoder 716 in response to GEN(0)–GEN(n–1).

Compare circuit 1002 compares prefix assignment information from array groups 122 with PFX to determine which array group or groups 122 are assigned to PFX. The array groups that have prefixes that match PFX have an associated GEN signal set to an active state by compare circuit 1002 such that the V bits for those array groups are provided to priority encoder 716 and full flag logic 715 by the enable logic. Compare circuit 1002 deactivates all other GEN signals such that the V bits from those array groups that have prefixes that do not match PFX are not passed (as active signals) to priority encoder 716 and full flag logic 715. In response to GEN(0)–GEN(n–1), respective logic gates 1004(0)–1004(n–1) either qualify or disqualify the V bits from corresponding array groups 122(0)–122(n–1) for consideration by priority encoder 716 in generating NFA_A. For example, if GEN(0) is activated, which indicates that array group 122(0) is assigned to PFX, logic gate 1004(0) allows the V bits from array group 122(0) to pass to priority encoder 716 and full flag logic 715 as QV bits. Conversely, if GEN(0) is deactivated, which indicates that array group 122(0) is not assigned to PFX, logic gate 1004(0) disqualifies V bits from array group 122(0) by forcing corresponding QV bits to full states (i.e., indicating that these entries are full). In this manner, the V bits from array group 122(0) do not participate in the generation of NFA_A or the FF signal for that particular prefix.

The enable logic circuits 1004 may be replaced with a multiplexer.

For an alternative embodiment, compare circuit 1002 may be compare circuit 506 of FIG. 5A and enable logic circuits 1004 may be enable logic circuits 504 of FIG. 5A and one or more multiplexers may be added to supply either the GMF signals or the MV bits to the compare circuit in response to either a compare operation or determining NFA, respectively. Additionally, one or more multiplexers may be added to provide either the match line signals or the V bits to the enable logic in response to either a compare operation or determining NFA, respectively.

Figure 11:
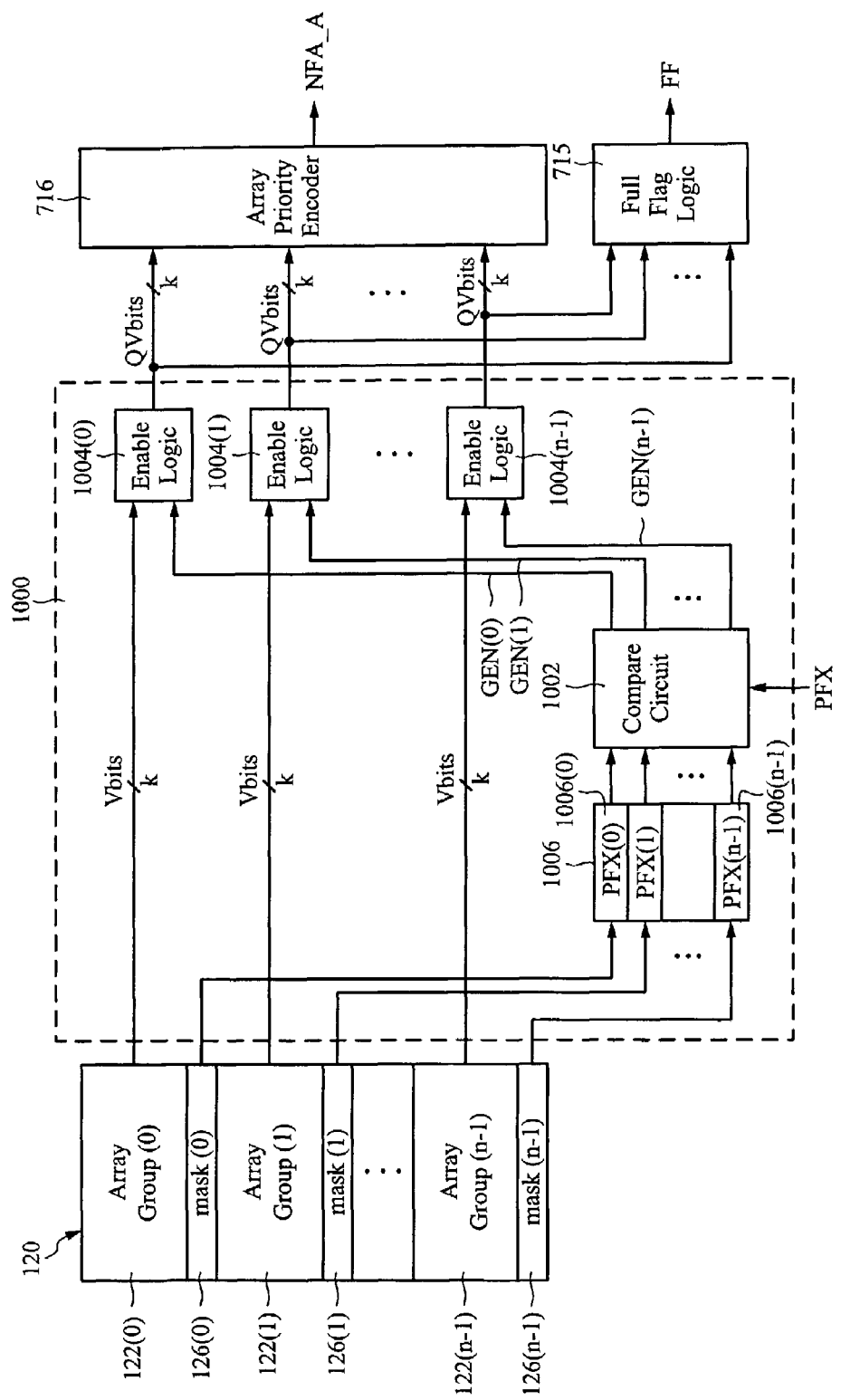
FIG. 11 is a block diagram of another embodiment of the select circuit of FIG. 7.

For an alternative embodiment, as shown in FIG. 11, the prefixes for assigned group arrays are stored in a separate table 1006. Table 1006 stores prefixes PFX(0)–PFX(n–1) in rows 1006(0)–1006(n–1), respectively, for corresponding array groups 122(0)–122(n–1). The prefixes may be stored in table 1006 at the same time that the prefixes are written into the group global masks, at reset, upon initialization, or at any other time. For one embodiment, the table entries may be accessed for reading or updating by group decoder 117 in response to decoding NFA_G. The prefixes may be provided to compare circuit 1002 for comparison with PFX as indicated above. For one embodiment, compare circuit 1002 and table 1006 may be formed from the priority logic 604 and priority memory 602, respectively, as shown in FIG. 6.

For an alternative embodiment, compare circuit 1002 may be compare circuit 506 of FIG. 5B and enable logic circuits 1004 may be enable logic circuits 504 of FIG. 5B and one or more multiplexers may be added to supply either the GMF signals or the MV bits to table 508 in response to either a compare operation or determining NFA, respectively. Additionally, one or more multiplexers may be added to provide either the match line signals or the V bits to the enable logic in response to either a compare operation or determining NFA, respectively.

The embodiments described herein have focused on CIDR address processing. However, system 100 and its various embodiments, may be used to store and operate upon any types of groups of data wherein each data group has an associated priority relative to the other groups.

For one example, all of the priority numbers can be set to zero and CAM system 100 may operate as a traditional binary CAM array.

CAM system 100 may also be used to process classfull IP addresses with each array group assigned to a corresponding class A, B, or C.

CAM system 100 may also have its group global mask values decoupled from the priority numbers such that system 100 may process different types of data not necessarily associated by groups with prefixes. For example, all group global masks may be assigned to be unmasked, and the array groups may operate as logical tables each storing the same or different types of data. The data types may be indicated by storing the priority numbers associated with each array group in table 508 of FIG. 5B and/or table 1006 of FIG. 11.

Also, priority numbers may also indicate different search criteria for each array group and not necessarily indicate priority between the arrays.

In other embodiments of CAM system 100 of FIG. 1, binary CAM array 120 may be replaced by a ternary CAM array. This may be particularly useful, for example, in classification operations (e.g., policy-based routing) on incoming packet information for a router incorporating CAM system 100. However, other applications may also benefit from the use of a ternary CAM array in CAM system 100. The remainder of this application will discuss CAM system 100, and its various embodiments, using a ternary CAM array in the context of a policy-based routing system. However, system 100 may be used to store and operate upon any types of groups of data wherein each data group has an associated priority relative to the other groups.

Policy-based routing allows packets to be routed in a network according to one or more criteria such as, for example, the source and/or destination address of the packet, protocol information, the cost of forwarding the packet through different routes or paths in the network, or the bandwidth available on different routes in the network. Policy-based routing can also be used to provide a certain Quality of Service (QOS) or Type of Service (TOS) to differentiated traffic in the network. For example, one or more of the various fields (e.g., the TOS bits) in the header of an Internet Protocol (IP) packet can be used by policy-based routers to forward IP packets in a network.

A policy-based router implements a policy through the use of one or more policy statements that define how to forward the packet in the network. Each policy statement contains one or more match clauses and a set clause. The match clauses are a series of conditions that are used to determine if an incoming packet satisfies a particular policy. If all of the match clauses of a policy statement are satisfied, the set clause specifies how the router should forward the packet in the network. If one of the match clauses of a particular policy statement is not satisfied, then the policy-based router investigates subsequent policy statements.

A policy-based router can use a ternary CAM array to implement a filtering or classification function to determine whether an incoming packet matches a policy statement. The policy statements are typically stored in separate rows in the ternary CAM array. Corresponding fields or clauses of each policy statement are selectively masked on a bit-by-bit basis during a compare operation with a search key associated with the packet to select appropriate routing information for the packet. For example, each policy field that corresponds to a match clause for a given policy statement is unmasked by having its corresponding mask bits set, for example, to a logic zero. Conversely, each policy field that does not have a match clause for a given policy statement is masked by having its corresponding mask bits set, for example, to a logic one.

Figure 13:
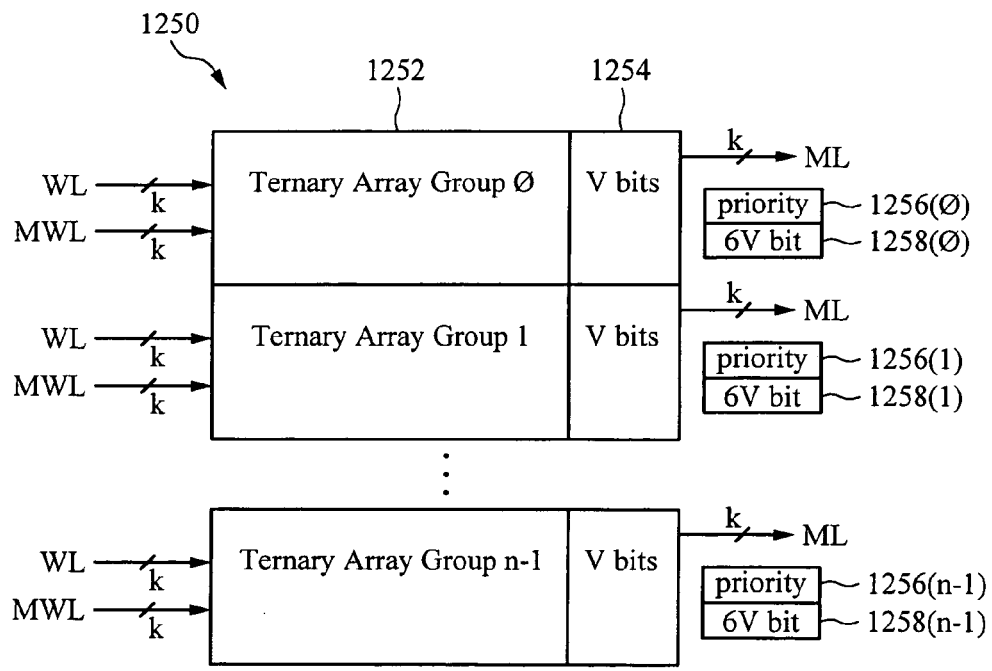
FIG. 13 is a block diagram of one embodiment of a ternary CAM array that may be used in the CAM system of FIG. 1.

FIG. 13 shows a ternary CAM array 1250 that may be used instead of binary CAM array 120 in ternary embodiments of CAM system 100 of FIG. 1. Ternary CAM array 1250 is segmented into a number of groups 0 to n−1, each of which includes a ternary array 1252. Each array group 1252(0)–1252(n−1) includes k rows of CAM cells (not shown in FIG. 13) for storing up to k data words, and also includes k rows of local mask cells (not shown in FIG. 13) for storing local mask words that mask corresponding data words in the array group on a bit-by-bit basis. The CAM cells and local mask cells are paired together on a bit-by-bit basis to form rows of ternary CAM cells that effectively can store three states: a logic one state, a logic zero state, and a don't care state.

For alternative embodiments, one or more of the array groups 1252 may have a different number of rows of CAM cells. Each row of CAM cells is coupled to a corresponding word line WL and a corresponding match line ML. Each row of local mask cells is coupled to a corresponding mask word line MWL. The word, mask word, and match lines for each array group 1252(0)–1252(n−1) are represented collectively in FIG. 13.

Each array group 1252 includes an extra column 1254 of CAM cells for storing a valid bit (V bit) for each row in the array group 1252. Each V bit indicates whether a valid word is stored in the corresponding row. Upon reset or power-up, the V bits are initially de-asserted to logic 1 so as to indicate that CAM array 1250 is empty, i.e., that none of the rows in CAM array 1250 contain valid data. When data is written to a row of CAM array 1250, its corresponding V bit may be asserted to logic 0 in a well-known manner to indicate that the row contains valid data. In some embodiments, each row of CAM array 1250 may include two or more V bits to distinguish between an empty row and a row that contains invalid data (and may indicate other states such as, for instance, a skip state).

Each array group 1252 that stores data is assigned a priority number that indicates its priority relative to the other array groups. The array groups 1252 can be assigned any priority in any order, and more than one array group may be assigned the same priority. Each array group 1252(0)–1252(n−1) has a corresponding storage element 1256(0)–1256(n−1) for storing its priority number. Storage elements 1256(0)–1256(n−1) may be any types of storage elements, including volatile and non-volatile memories. In some embodiments, storage elements 1256(0)–1256(n−1) are individual storage elements. In other embodiments, each storage element 1256(0)–1256(n-1) is one or more rows of a single storage element. In one embodiment, the priority numbers for array groups 1252 are stored in a priority table.

Each array group 1252 also has an associated group valid (GV) bit that indicates whether the array group 1252 is assigned a priority number. The GV bits for array groups 1252 may be stored in corresponding storage elements 1258, as shown in FIG. 13. For other embodiments, the GV bits may be stored in one or more separate storage elements.

For alternate embodiments, storage elements 1256 may be included within index circuit 130 (see also FIG. 1). For one embodiment, the priority numbers and GV bits for array groups 1252(0)–1256(n-1) may be stored in additional columns of a priority table priority table 600 of FIG. 6.

Figure 14:
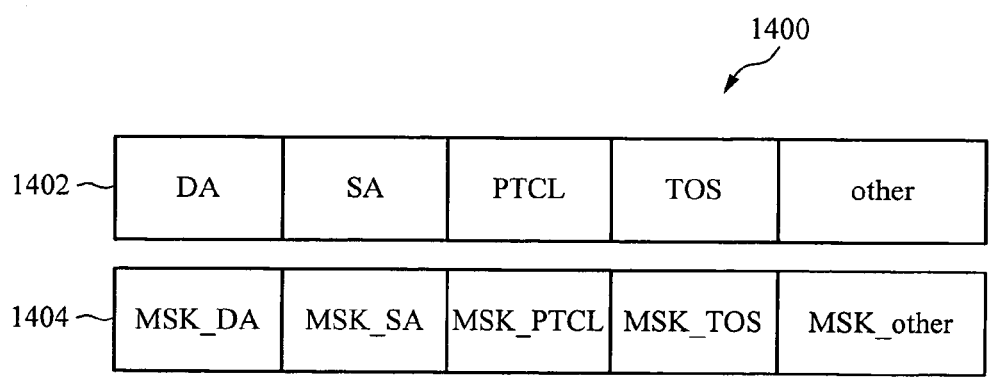
FIG. 14 is a block diagram illustrating one embodiment of a row of the ternary CAM array of FIG. 13.

Ternary CAM array 1250 may store and operate upon any type of data. For network routing applications, the data words stored in ternary array 1250 may include, for example, a network routing address and/or corresponding policy information for the address. For example, FIG. 14 illustrates a row 1400 for one embodiment of ternary CAM array 1252 that may be used to store routing addresses and corresponding policy information such as, for instance, one or more clauses of a policy statement. Row 1400 includes a data word 1402 and a local mask word 1404. Data word 1402 is shown to include fields to store a destination address (DA), a source address (SA), an applicable protocol (PTCL), a type of service (TOS), and other policy information (e.g., bandwidth guarantees). Local mask word 1404 includes a policy mask that masks corresponding fields of CAM word 1402. Thus, local mask word 1402 includes a destination address mask (MSK_DA), a source address mask (MSK_SA), a protocol mask (MSK_PTCL), type of service mask (MSK_TOS), and a mask for other policy information (MSK_other). Note that in other embodiments, CAM word 1402 and local mask word 1404 may include any number of corresponding fields. In some embodiments, CAM word 1402 and local mask word 1404 may include dissimilar numbers of fields, for example, where it is desired to leave one or more fields of CAM word 1402 unmasked. The information stored in a particular group can each be assigned a common priority number that represents the priority of the entries in the array group relative to the entries in the other array groups.

Figure 15:
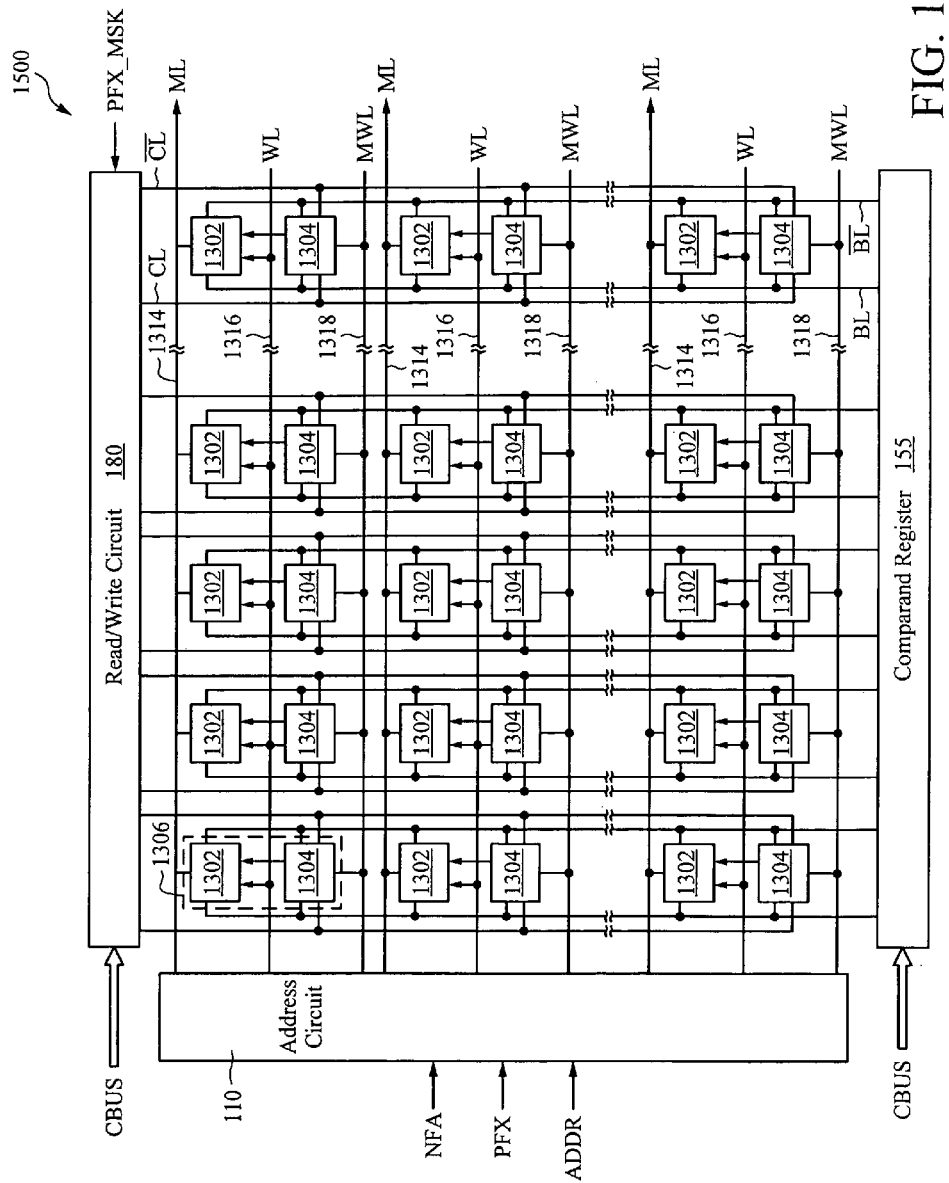
FIG. 15 is a block diagram of one embodiment of a ternary array group of FIG. 13.

FIG. 15 shows a ternary array group 1500 that is one embodiment of array group 1252 of FIG. 13. Array group 1500 is coupled to address circuit 110, read/write circuit 155, and comparand register 180. Further, although not shown in FIG. 15, array group 1500 is also coupled to index circuit 130. Array group 1500 includes a plurality of rows that each include any number of ternary CAM cells 1306, each of which includes a CAM cell 1302 and a corresponding local mask cell 1304. CAM cells 1302 may be any well-known CAM cell. Local mask cells 1304 may be any well-known memory element, including volatile and non-volatile memory cells. The validity bits may also be included in additional columns of CAM cells 1302. For simplicity, connections to CLK are not shown in FIG. 15.

Each row of CAM cells 1302 is coupled to a match line ML and a word line WL, and each row of local mask cells 1304 is coupled to a corresponding row of CAM cells 1302 and to a mask word line MWL. Each column of CAM cells 1302 and mask cells 1304 is coupled to a bit line BL, a complementary bit line $\overline{BL}$, a comparand line CL, and a complementary comparand line $\overline{CL}$. The bit lines BL and $\overline{BL}$ are coupled to read/write circuit 155, which in turn may enable data to be written to or read from a row of CAM cells 1302 or local mask cells 1304. Read/write circuit 155 is well-known, and may include write drivers or buffers to provide data to BL and $\overline{BL}$, and may include sense amplifiers to determine the logic states of BL and $\overline{BL}$. Comparand lines CL and $\overline{CL}$ are coupled to comparand register 180, and provide comparand data or a search key to CAM cells 1302 for comparison with data stored therein.

In other embodiments, comparand lines CL and $\overline{CL}$ may be eliminated, and the bit lines BL and $\overline{BL}$ used to provide comparand data to CAM cells 1302. Additionally, while ternary array group 1500 shows columns of CAM cells 1302 and mask cells 1304 coupled to common bit lines, in alternate embodiments mask cells 1304 may be coupled to separate mask bit lines. Further, word lines WL and MWL may be the same word line.

The word lines WL are selectively driven by address circuit 110 in response to either ADDR or the NFA to select one or more rows of CAM cells 1302 for read and/or write operations. Similarly, the mask word lines MWL are selectively driven by address circuit 110 in response to either ADDR or the NFA to select one or more rows of mask cells 1304 for read and/or write operations. Each match line ML indicates the match results of a compare operation for its corresponding row. A match line ML indicates a match condition for the row only if all unmasked CAM cells 1302 in that row match the search key. In some embodiments, the match line ML is pre-charged for the compare operation. If any unmasked CAM cell 1302 in the row does not match the search key, the CAM cell(s) 1302 discharges the match line ML toward ground potential (e.g., logic 0) to indicate the mismatch condition. Otherwise, if all unmasked CAM cells 1302 match the search key, the match line ML remains in a charged state (e.g., logic high) to indicate the match condition.

Each CAM cell 1302 and local mask cell 1304 pair may be considered a mask-per-bit ternary CAM cell 1306 in which the local mask cell 1304 is used to store mask data for its corresponding CAM cell 1302. For alternate embodiments, local mask cell 1304 may be used to store mask data for more than one CAM cell 1302. Ternary CAM cell 1306 may be any well-known ternary CAM cell.

Data is written to and read from array group 1500 in a manner similar to that described above with respect to FIG. 2. Thus, to write or read a data word to or from a row of CAM cells 1302, address circuit 110 selects the row of CAM cells 1302 in response to either ADDR or NFA by asserting the corresponding word line WL, and read/write circuit 155 provides the data word to, or reads it from, the selected row of CAM cells 1302 over BL and $\overline{BL}$.

When the embodiment of FIG. 13 is used with the address circuit 702 of FIG. 7, the NFA in the ternary CAM array 1250 at which to store the new data word is selected from NFA table 112 according to the priority of the new data word. For example, the priority of the data word may be provided on PBUS to address circuit 110 and used to access a corresponding row of NFA table 112. NFA table 112 provides the selected NFA to address decoder 114, which in turn selects a corresponding row of ternary array group 1500 as described above. If there is not an NFA for the priority in NFA table 112, an unassigned array group 1252 (e.g., an array group whose group valid bit is not asserted) is selected by index circuit 130 and assigned to the priority. For each write operation, index circuit 130 updates the NFA stored in NFA table 112 for the priority. Note that because the priority provided to address circuit 110 for ternary embodiments need not be decoded, prefix decoder 111 of FIG. 7 may be eliminated from ternary embodiments of CAM system 100.

Similarly, to write or read a local mask word to or from a row of mask cells 1304, address circuit 110 selects the row of mask cells 1304 in response to either ADDR or NFA by asserting the corresponding mask word line MWL (e.g., to logic high), and read/write circuit 155 provides the mask word to, or reads the mask word from, the selected row of mask cells 1304 over BL and $\overline{BL}$. Mask information corresponding to data to be stored in array group 1500 may be written as a local mask word to a row of mask cells 1304 either before or after associated data is written to the corresponding row of CAM cells 1302.

Index circuit 130 generates the NFA during write operations for ternary array groups 1500(0)–**1500(*n*-1) based upon priority in a manner similar to that described above with respect to FIGS. 1, 7, 8, 10 and 11. For example, the V bits 1254 are operated upon in a similar manner as are the V bits 124 of FIG. 1, the GV bits are operated upon in a similar manner as are the MV bits 128 of FIG. 1, and the priority numbers per group are operated on in a similar manner as are the group global masks 126 of FIG. 1. The index circuit may generate the NFA in response to the V bits from array groups 1252(0)–1252(*n*-1) and the GV bits stored in storage elements 1256(0)–1256(*n*-1). Specifically, those assigned array groups that have assigned priority numbers that matches the priority of the data word to be written into CAM array 1250 will cause corresponding enable logic circuits to generate qualified V bits (QV bits) for use by array priority encoder 716 and full flag logic 715**. All other V bits are disqualified. Additionally, the comparison of the priority numbers may be qualified by the states of the GV bits such that only those array groups that have been assigned priority numbers participate in a comparison with the priority number of the new data entry.

Figure 16:
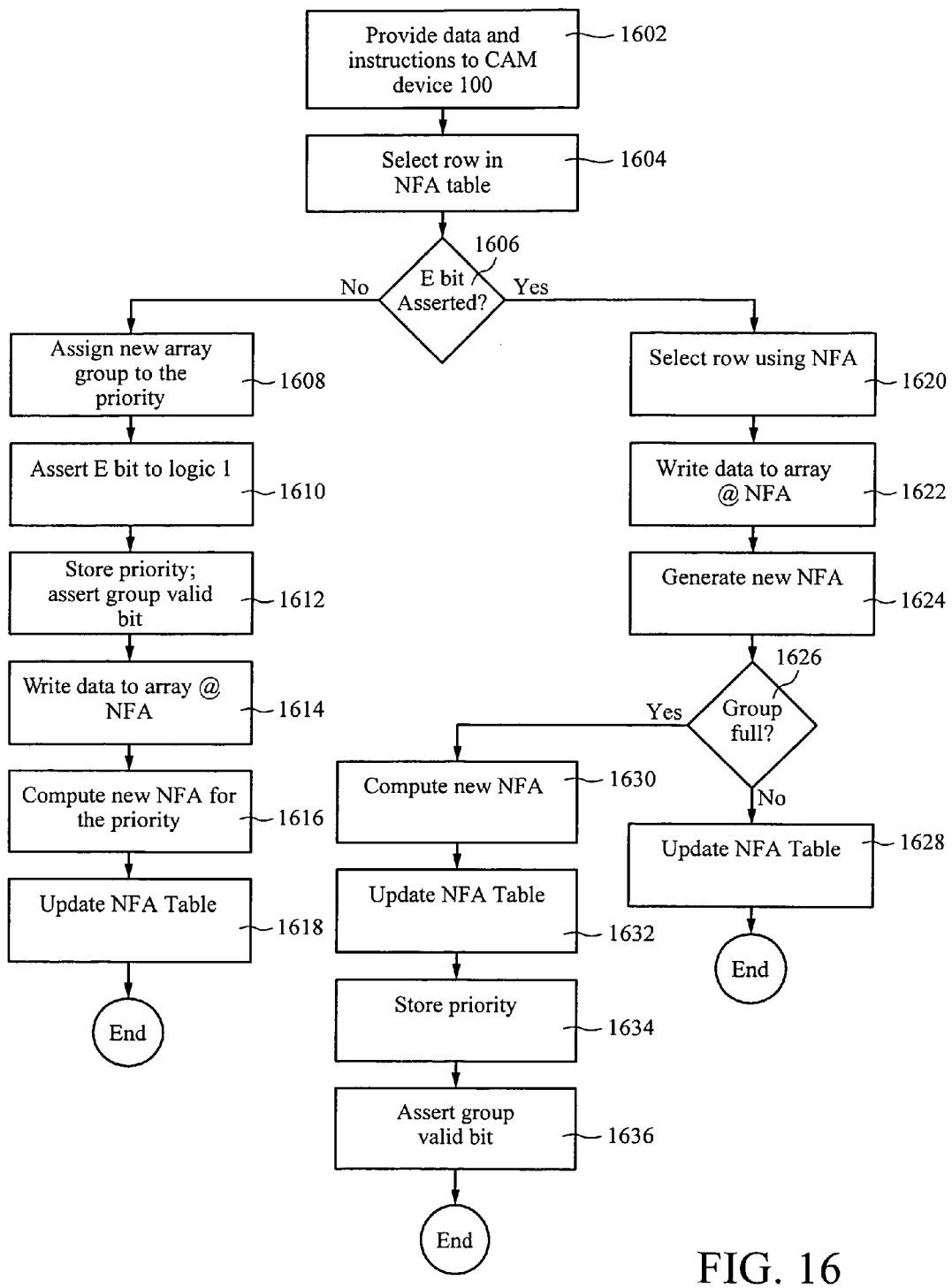
FIG. 16 is a flow chart illustrating one embodiment of a compare operation for ternary embodiments of the CAM system of FIG. 1.

FIG. 16 is flow chart illustrating one embodiment of writing a new data entry to array 1250 and updating the NFA for the priority associated with the entry. At step 1602, a write instruction is provided to instruction decoder 140 via IBUS, the data entry is supplied to read/write circuit 155, and the priority for the data entry is provided to NFA table 112 and to decoder 170. The priority for the entry is used to select a corresponding row 101 of NFA table 112 (step 1604). The E bit 104 for this row is provided to write control circuit 116. If the E bit for the selected row is not asserted (e.g., E=0), as tested in step 1606, thereby indicating that there is not an array group 1252 that has the same priority as the data entry, one of the available array groups is assigned to the priority number (step 1608). Index circuit 130 computes an NFA for the priority, and the new NFA is stored in the selected row 101 of NFA table 112. Since NFA_G indicates the next free group, the new NFA is determined by group priority encoder 712 generating NFA_G from the group valid bits for the array groups, and write control circuit 116 sending a control signal to NFA table 112 to load NFA_G into its selected row 101. The NFA_A portion of the selected row may be written to all zeros to indicate the first available address in this newly opened array group. The corresponding E bit 104 in the selected row in NFA table 112 is then asserted to logic 1 (step 1610).

The new entry is then written into array 1250 as follows. Group decoder 117 decodes NFA_G to select the appropriate array group for the new entry, and the priority associated with the new data entry is stored in storage element 1256 as the priority number assigned to the selected array group. Also, the GV bit corresponding to the selected array group is asserted to logic 1 (step 1612). The new NFA stored in the selected row 101 is then provided to array decoder 114. In response thereto, array decoder 114 enables the corresponding word line of the selected array group 1252 and the new entry is written into the selected array group (step 1614). After the new entry has been written to array 1250, index circuit 130 computes a new NFA for the selected array group 1252 (step 1616). The new NFA is determined by generating NFA_A from array priority encoder 716 for the associated priority as described above with respect to FIG. 10 and/or FIG. 11 using the priority numbers per group instead of the group masks. NFA_A is then written into the selected row of NFA table 112 (step 1618).

If the E bit of the selected row 101 of NFA table 112 is already asserted to logic 1 at step 1606, thereby indicating that an array group 1252 is already assigned to the priority of the data entry, the NFA stored in the selected row 101 is provided to array decoder 114 to select a row in the corresponding assigned array group 1252 (step 1620). The data entry is then written into the row of the array group selected by the NFA (step 1622) and its V bit is updated. V bit select circuit 711 forwards the V bits of the selected array group 1252 as qualified valid bits (QV bits) to full flag logic 715 and to array priority encoder 716. In response thereto, array priority encoder 716 generates a new NFA_A (step 1624), which is provided to NFA table 112, and full flag logic 715 determines whether the selected array group 1252 is full, and generates FF accordingly (step 1626). If the selected array group 122 is not full, as determined in step 1626, FF remains de-asserted to logic 0, and the new NFA_A is written to the selected row 101 of NFA table 112 under the control of write control circuit 116, thereby updating NFA table 112 for the priority (step 1628). For an alternative embodiment, step 1628 may precede step 1624, and step 1624 may be executed if an array group is not full.

If, on the other hand, the selected array group 1252 becomes full after the write operation (step 1626), full flag logic 715 asserts FF to logic 1, and index circuit 130 generates a new NFA that identifies a row in a next available array group 1252 for the priority (step 1630). Specifically, group priority encoder 712 generates a new NFA_G for the priority in response to the GV bits and provides the NFA_G to NFA table 112. In response to the de-asserted FF, write control circuit 116 causes NFA_G to be written into the selected row of NFA table 112 and the NFA_A portion of the table to reset to all zeros (step 1632). Then, a new array group can be assigned the priority number. For example, the priority of the data entry is stored as the priority number of the selected array group (step 1634), and its group valid bit is asserted (step 1636), thereby assigning the next available array group 1252 to the priority.

For compare operations, comparand register 180 provides the search key from CBUS to comparand register 180, and a priority associated with the search key is provided to index circuit 130 (see also FIG. 1). As shown, for example, in FIG. 15, comparand register 180 provides bits of the search key to corresponding cells 1302 in each row of array group 1500 via comparand lines CL and $\overline{CL}$. The mask cells 1304 selectively mask comparison of the search key with data stored in cells 1302 according to mask bits stored in the mask cells. If all unmasked CAM cells 1302 in a row indicate a match condition, a match condition is indicated on the corresponding match line ML. If one or more unmasked CAM cells 1302 indicate a mismatch condition, a mismatch condition is indicated on the match line. For one embodiment, a mask bit of logic zero indicates that corresponding data is not to be masked, and a mask bit of logic one indicates that corresponding data is to be masked. For other embodiments, polarity of the mask bits may be reversed.

Match results from all array groups 1252(0)–1252(n-1) are provided to index circuit 130, which in turn determines which matching entry has the highest priority number associated with it and generates the HPI in a manner similar to that described above with the respect to FIGS. 1, 3, 4, 5A, 5B, 6 and 12. In these embodiments, the group global masks 126 are replaced with the priority numbers stored in storage elements 1256. For example, during compare operations, all matching entries (as masked by their local mask cells) are reflected on the match lines of the respective groups and the match results provided to index circuit 130. Index circuit 130 determines the matching entry that has the highest priority number associated with it and generates the index or address of this highest priority matching entry (HPI). If there are multiple array groups that have matching entries and they have the same priority number, or if there are multiple matching entries within a single array group, index circuit 130 determines HPI based on which matching entry is stored in the lowest numerical address of array 120. For alternative embodiments, index circuit 130 may determine HPI based on entries stored in array 120 in other predetermined arrangements (e.g., at the highest numerical address).

Figure 17:
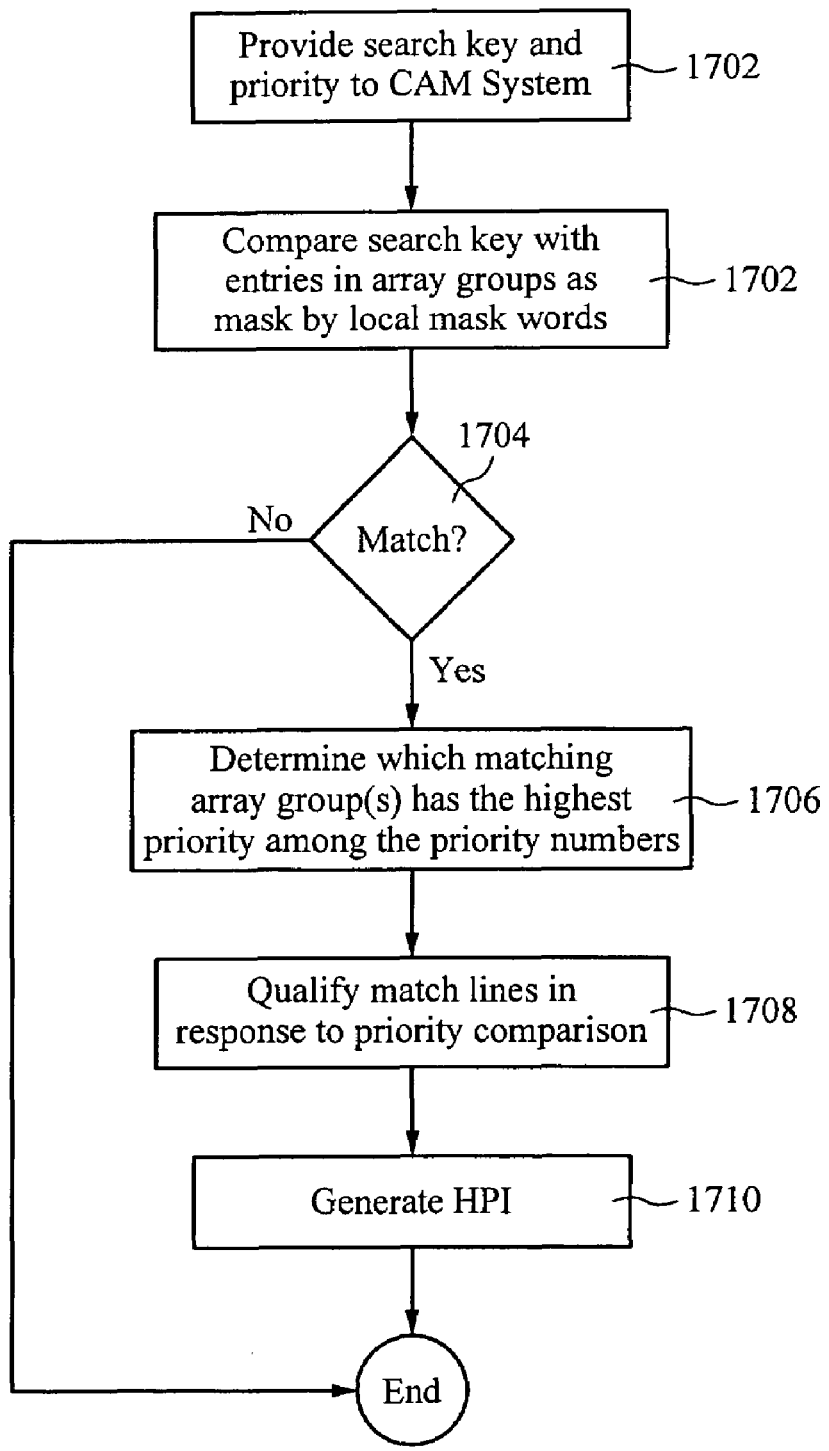
FIG. 17 is a flow chart illustrating one embodiment of a write operation for ternary embodiments of the CAM system of FIG. 1.

FIG. 17 shows a flow chart illustrating one embodiment of compare operation for ternary embodiments of CAM system 100. At step 1700, a search key and associated priority are provided to CAM array 1250. The search key is compared with entries stored in array groups 1252(0)–1252(n-1) as masked by the local mask words (step 1702). For each matching entry, the corresponding match line ML is asserted to indicate the match condition. If there is a match in one or more array groups 1252(0)–1252(n-1), as tested in step 1704, the ML select circuit 302 uses the priority number assignments (from storage elements 1256) for array groups 1252(0)–1252(n-1) to select which of the array groups 1252(0)–1252(n-1) has the highest priority among the priority numbers (step 1706). In response thereto, ML select circuit 302 qualifies or allows the match signals from the selected array group 1252 to pass to priority encoder 304, and disqualifies the match signals from all other array groups by, for instance, forcing their corresponding qualified match lines QML to a mismatch state (e.g., ground potential) (step 1708). If more than one array group 1252 that has a matching entry, and each have the same priority, ML select circuit 302 enables the match signals from each such "matching" array group 1252 to pass through to priority encoder 304. Priority encoder 304 then generates HPI in response to the qualified match signals on QML (step 1710). Because only the match signals corresponding to the matching array group(s) that match have the highest priority are considered by priority encoder 304, priority encoder 304 can generate the appropriate HPI regardless of how the priorities are assigned to the various array groups. That is, the array groups do not have to be sorted by physical location. Any priority number can be assigned to any array group.

Note that the "highest priority" of the priority numbers can be the smallest numerical priority number, the largest numerical priority number, or can be any other predetermined selection among the priority numbers.

By segmenting CAM array 1250 into a plurality of array group 1252(0)–1252(n-1), and assigning each array group 1252(0)–1252(n-1) to a particular priority, present embodiments are able to perform policy based routing functions according to priority, thereby allowing for selective searching according to assigned priorities of routing address and policy information stored in array 1250. Further, ternary embodiments of CAM system 100 allow new entries to be written into CAM array 1250 without having to re-prioritize or re-order existing entries, thereby eliminating or reducing the overhead for table management hardware and/or software tools used to maintain a proper priority ordering.

It should be also appreciated that in other embodiments, the circuitry and components described above to determine NFA for a new entry may be omitted, and the NFA may be maintained by other components and/or software that is in communication with the CAM systems described above.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A content addressable memory (CAM) system comprising:
   a ternary CAM array segmented into a plurality of array groups, each array group including a plurality of rows of ternary CAM cells; and
   a plurality of first storage elements each for storing a priority of a corresponding array group, wherein the priorities are assigned to the array groups irrespective of the physical locations of the array groups relative to each other.

2. The CAM system of claim 1, wherein two or more array groups have the same priority.

3. The CAM system of claim 1, wherein one of the rows of ternary CAM cells comprises:
   a plurality of CAM cells for storing a data word; and
   a plurality of mask cells for storing a local mask word.

4. The CAM system of claim 3, wherein each data word comprises a policy statement.

5. The CAM system of claim 4, wherein the policy statement comprises protocol information.

6. The CAM system of claim 4, wherein the policy statement comprises type-of-service information.

7. The CAM system of claim 4, wherein the policy statement comprises cost-of-service information.

8. The CAM system of claim 4, wherein each local mask word includes a policy mask.

9. The CAM system of claim 1, further comprising a plurality of second storage elements each for storing a group valid bit indicating whether an associated array group is assigned its corresponding priority number.

10. The CAM system of claim 1, further comprising a priority table including the plurality of first storage elements.

11. The CAM system of claim 1, further comprising an index circuit coupled to the ternary CAM array to determine the index of a location in the ternary CAM array that stores data that matches a search key.

12. The CAM system of claim 11, wherein the index circuit comprises:
   a select circuit having a plurality of inputs to receive match signals from the plurality of array groups, each match signal indicative of a result of a comparison between the search key and the data stored in the array groups, and having a plurality of outputs to provide qualified match signals for the plurality of array groups; and
   a priority encoder having a plurality of inputs to receive the plurality of qualified match signals, and having an output to provide the index of the highest priority location in the ternary CAM array that stores data that matches the search key in response to the qualified match signals.

13. The CAM system of claim 12, wherein the select circuit includes means for selectively forcing non-qualified match signals to a mismatch state.

14. The CAM system of claim 12, wherein the select circuit further comprises:
   a plurality of logic gates, each having first inputs to receive the match signals from a corresponding array group, a second input to receive an enable signal for the corresponding array group, and outputs to selectively provide the match signals to the priority encoder as qualified match signals in response to the enable signal; and
   a compare circuit for generating the enable signals in response to a comparison between the priorities associated with array groups that have data stored that matches the search key.

15. The CAM system of claim 14, further comprising a priority table including the plurality of first storage elements.

16. The CAM system of claim 15, wherein the select circuit further comprises a plurality of group match flag circuits, each receiving the match signals from a corresponding array group and generating a group match flag in response thereto, wherein the group match flags are provided as select signals to corresponding rows of the priority table.

17. The CAM system of claim 1, further comprising:
   means for storing data in the array groups according to priority.

18. The CAM system of claim 1, further comprising an address circuit coupled to the ternary CAM array to select a row of the ternary CAM cells for communicating data.

19. The CAM system of claim 18, wherein the address circuit comprises an address decoder to select a row in one array group corresponding to the priority in response to a next free address (NFA).

20. The CAM system of claim 19, wherein the address circuit further comprises an NFA table having a number of rows, each row for storing the NFA for a corresponding priority.

21. The CAM system of claim 20, wherein each row in the NFA table includes an empty bit storage element for storing an empty bit indicative of whether any array group is assigned to the corresponding priority.

22. The CAM system of claim 9, wherein each of the rows of ternary CAM cells includes a valid bit storage element for storing a valid bit indicative of whether the corresponding row of ternary CAM cells stores valid data.

23. The CAM system of claim 9, further comprising an index circuit coupled to the valid bit storage elements to determine a next free array address for an array group and its associated priority, and further coupled to the plurality of second storage elements to determine a next free group address for the array group and its associated priority.

24. The CAM system of claim 23, wherein the index circuit comprises:
   a select circuit having a plurality of inputs to receive the valid bits from the plurality of array groups, and having a plurality of outputs to provide qualified valid bits for the plurality of array groups; and
   a priority encoder having a plurality of inputs to receive the plurality of qualified valid bits, and having an output to generate the next free array address in response to the qualified valid bits.

25. The CAM system of claim 24, wherein the select circuit includes means for selectively forcing non-qualified valid bits to a mismatch state.

26. The CAM system of claim 24, wherein the select circuit further comprises:
   a plurality of logic gates, each having first inputs to receive the valid bits from a corresponding array group, a second input to receive an enable signal for the corresponding array group, and outputs to selectively provide the valid bits to the priority encoder as qualified valid bits in response to the enable signal; and
   a compare circuit for generating the enable signals in response to a comparison between the priority of the data and the priorities of the array groups.

27. The CAM system of claim 24, wherein the index circuit further comprises:
   a group priority encoder having a plurality of inputs to receive the group valid bits from each of the plurality of array groups, and having an output to provide the next free group address.

28. A method of operating a content addressable memory (CAM) system including an array of ternary CAM cells segmented into a plurality of array groups, comprising:
   storing a plurality of priorities in a plurality of storage elements each associated with one or more of the array groups, wherein each array group includes a plurality of rows of the ternary CAM cells;
   assigning the priorities to the array groups irrespective of the physical locations of the array groups relative to each other; and
   selectively storing data in the array groups according to the priorities.

29. The method of claim 28, wherein the selectively storing data comprises:
   providing a next free address (NFA) of an available row of ternary CAM cells within an array group corresponding to one of the priorities; and
   storing the data at the NFA.

30. A method of operating a content addressable memory (CAM) system including an array of ternary CAM cells segmented into a plurality of array groups, comprising:
   storing a plurality of priorities in a plurality of storage elements each associated with one or more of the array groups; and
   selectively storing data in the array groups according to the priorities,
   wherein the selectively storing data comprises:
      providing a next free address (NFA) of an available row of ternary CAM cells within an array group corresponding to one of the priorities; and
      storing the data at the NFA; and
   wherein providing the NFA comprises:
      generating the NFA;
      storing the NFA in a corresponding row of an NFA table;
      selecting a row of the NFA table using the priority; and
      accessing the NFA corresponding to the priority.

31. The method of claim 30, wherein generating the NFA comprises:
   for each array group, comparing associated priorities of the data with the priority of the array group to generate an enable signal;
   selectively allowing, in response to the enable signals, valid bits from corresponding array groups to participate in the generation of the NFA, the valid bits indicating whether valid data is stored in corresponding rows of each array group.

32. The method of claim 31, wherein the selectively allowing comprises:
 selectively qualifying the valid bits from each array group in response to the corresponding enable signal to generate qualified valid bits; and
 generating the NFA in response to the qualified valid bits.

33. The method of claim 31, wherein the generating the NFA further comprises:
 for each array group, storing a group valid bit indicative of whether the array group is assigned to one of the priorities; and
 generating a first portion of the NFA in response to the group valid bits.

34. The method of claim 28, further comprising:
 selectively comparing a search key with data stored in the array groups.

35. The method of claim 34, wherein the selectively comparing comprises:
 comparing the search key with data stored in the array groups to generate match signals;
 comparing the associated priorities of each array group that includes data that matches the search key to generate a plurality of enable signals; and
 selectively qualifying the match signals in response to the enable signals to generate qualified match signals.

36. The method of claim 35, further comprising:
 generating an index of the highest priority match (HPM) in response to the qualified match signals.

* * * * *